(12) United States Patent
Park et al.

(10) Patent No.: US 11,569,216 B2
(45) Date of Patent: Jan. 31, 2023

(54) SEMICONDUCTOR PACKAGE INCLUDING STACKED SEMICONDUCTOR CHIPS AND METHOD FOR FABRICATING THE SEMICONDUCTOR PACKAGE

(71) Applicant: SK hynix Inc., Icheon-si (KR)

(72) Inventors: Wan Choon Park, Icheon-si (KR); Gyu Jei Lee, Icheon-si (KR); Jong Hoon Kim, Icheon-si (KR); Tae Hun Yi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 65 days.

(21) Appl. No.: 17/165,479

(22) Filed: Feb. 2, 2021

(65) Prior Publication Data

US 2022/0077127 A1 Mar. 10, 2022

(30) Foreign Application Priority Data

Sep. 4, 2020 (KR) .................. 10-2020-0112936

(51) Int. Cl.
*H01L 23/31* (2006.01)
*H01L 25/18* (2006.01)
*H01L 23/48* (2006.01)
*H01L 21/56* (2006.01)
*H01L 21/768* (2006.01)
(Continued)

(52) U.S. Cl.
CPC ............ *H01L 25/18* (2013.01); *H01L 21/561* (2013.01); *H01L 21/565* (2013.01); *H01L 21/76898* (2013.01); *H01L 21/78* (2013.01); *H01L 23/3135* (2013.01); *H01L 23/481* (2013.01); *H01L 25/50* (2013.01)

(58) Field of Classification Search
CPC ...... H01L 25/18; H01L 21/563; H01L 21/565
See application file for complete search history.

(56) References Cited

U.S. PATENT DOCUMENTS 10,340,200 B2 * 7/2019 Miki .................... H01L 21/6836
10,847,468 B2 * 11/2020 Kim ........................ H01L 25/16
11,081,440 B2 * 8/2021 Park .................... H01L 21/4853
(Continued)

FOREIGN PATENT DOCUMENTS

KR 101762033 B1 7/2017

*Primary Examiner* — Thao P Le
(74) *Attorney, Agent, or Firm* — William Park & Associates Ltd.

(57) ABSTRACT

A semiconductor package includes: a second semiconductor chip including a second through electrode that penetrates a second body portion and a second connection electrode that is connected to one end of the second through electrode; a first semiconductor chip stack disposed over the second semiconductor chip and including a plurality of first semiconductor chips, each of the plurality of first semiconductor chips includes a first through electrode and a first connection electrode connected to one end of the first through electrode; a molding layer; a third semiconductor chip disposed over the molding layer and the first semiconductor chip stack; and an external connection electrode electrically connected to an other end of the second through electrode, wherein, the second semiconductor chip and the plurality of first semiconductor chips are electrically connected through the second through electrode, the second connection electrode, the first through electrodes, and the first connection electrodes.

22 Claims, 22 Drawing Sheets

(51) Int. Cl.
*H01L 21/78* (2006.01)
*H01L 25/00* (2006.01)

(56) References Cited

U.S. PATENT DOCUMENTS

| | | | |
|---|---|---|---|
| 11,145,626 B2* | 10/2021 | Hwang | H01L 21/76898 |
| 11,158,594 B2* | 10/2021 | Hong | H01L 23/481 |
| 11,217,517 B2* | 1/2022 | Oh | H01L 23/49816 |
| 11,289,454 B2* | 3/2022 | Kim | H01L 24/16 |
| 11,404,395 B2* | 8/2022 | Hwang | H01L 23/3135 |
| 11,424,172 B2* | 8/2022 | Ko | H01L 21/6835 |

\* cited by examiner

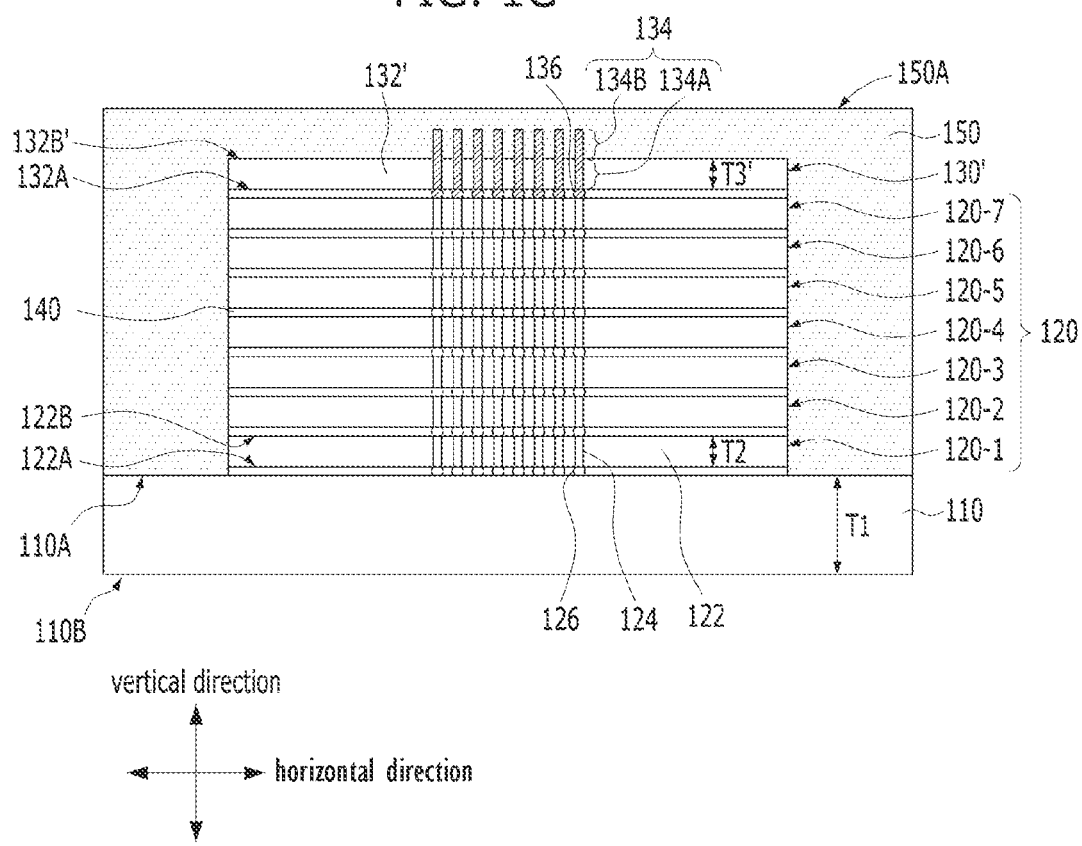

SEMICONDUCTOR PACKAGE INCLUDING STACKED SEMICONDUCTOR CHIPS AND METHOD FOR FABRICATING THE SEMICONDUCTOR PACKAGE

CROSS-REFERENCE TO RELATED APPLICATION

This application claims priority under 35 U.S.C. § 119 to Korean Patent Application No. 10-2020-0112936 filed on Sep. 4, 2020, which is incorporated herein by reference in its entirety.

BACKGROUND

1. Technical Field

This patent document relates to a semiconductor technology, and more particularly, to a semiconductor package in which a plurality of semiconductor chips are stacked in a vertical direction, and a method for fabricating the semiconductor package.

2. Related Art

Electronic products require multifunctional and high-volume data processing while their sizes are getting smaller. Accordingly, there is a growing need to increase a degree of integration of semiconductor devices used in such electronic products.

However, due to the limitation of semiconductor integration technology, it is difficult to satisfy a required function with only a single semiconductor chip, and thus a semiconductor package in which a plurality of semiconductor chips are embedded has been manufactured.

SUMMARY

In an embodiment, a semiconductor package may include: a second semiconductor chip including a second body portion, a second through electrode that penetrates the second body portion, and a second connection electrode that is connected to one end of the second through electrode; a first semiconductor chip stack disposed over the second semiconductor chip and including a plurality of first semiconductor chips stacked in a vertical direction, wherein each of the plurality of first semiconductor chips includes a first body portion, a first through electrode penetrating the first body portion, and a first connection electrode connected to one end of the first through electrode; a molding layer surrounding a side surface of the second semiconductor chip and the first semiconductor chip stack; a third semiconductor chip disposed over the molding layer and the first semiconductor chip stack; and an external connection electrode electrically connected to an other end of the second through electrode, wherein the second semiconductor chip and the plurality of first semiconductor chips are electrically connected through the second through electrode, the second connection electrodes, the first through electrode, and the first connection electrodes.

In another embodiment, a method for fabricating a semiconductor package may include: forming a first semiconductor chip stack including a plurality of first semiconductor chips stacked in a vertical direction, over a first surface of a semiconductor wafer, wherein each of the plurality of first semiconductor chips includes a first body portion, a first through electrode penetrating the first body portion, and a first connection electrode connected to one end of the first through electrode; forming a second semiconductor chip including a second body portion, a second through electrode that penetrates the second body portion, and a second connection electrode that is connected to one end of the second through electrode, over the first semiconductor chip stack; forming a molding layer surrounding a side surface of the second semiconductor chip and the first semiconductor chip stack, over the semiconductor wafer; forming an external connection electrode electrically connected to an other end of the second through electrode, over the molding layer; thinning a portion of the semiconductor wafer from a second surface of the semiconductor wafer, which is located opposite to the first surface of the semiconductor wafer; and dicing the semiconductor wafer and the molding layer.

BRIEF DESCRIPTION OF THE DRAWINGS

FIGS. 1A, 1B, 1C, 1D, 1E, and 1F are cross-sectional views illustrating a semiconductor package according to an embodiment of the present disclosure, and a method for fabricating the same.

DETAILED DESCRIPTION

Figure 1A:
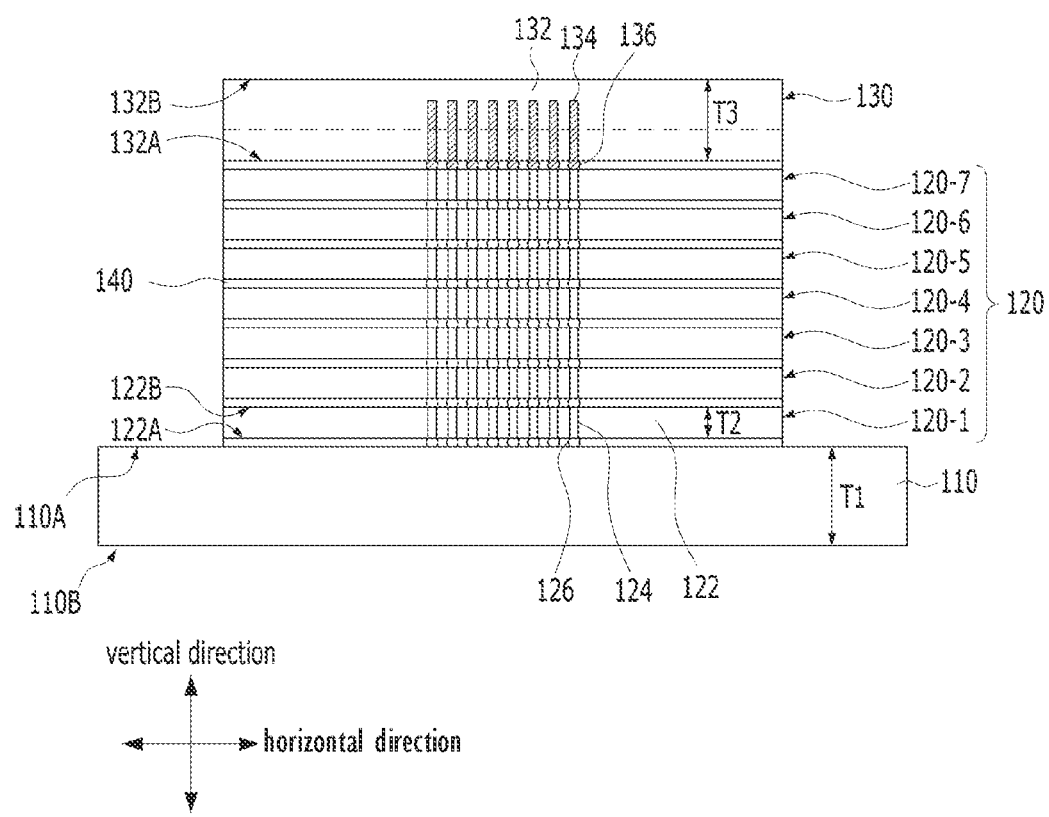

Hereinafter, various embodiments of the disclosure will be described with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
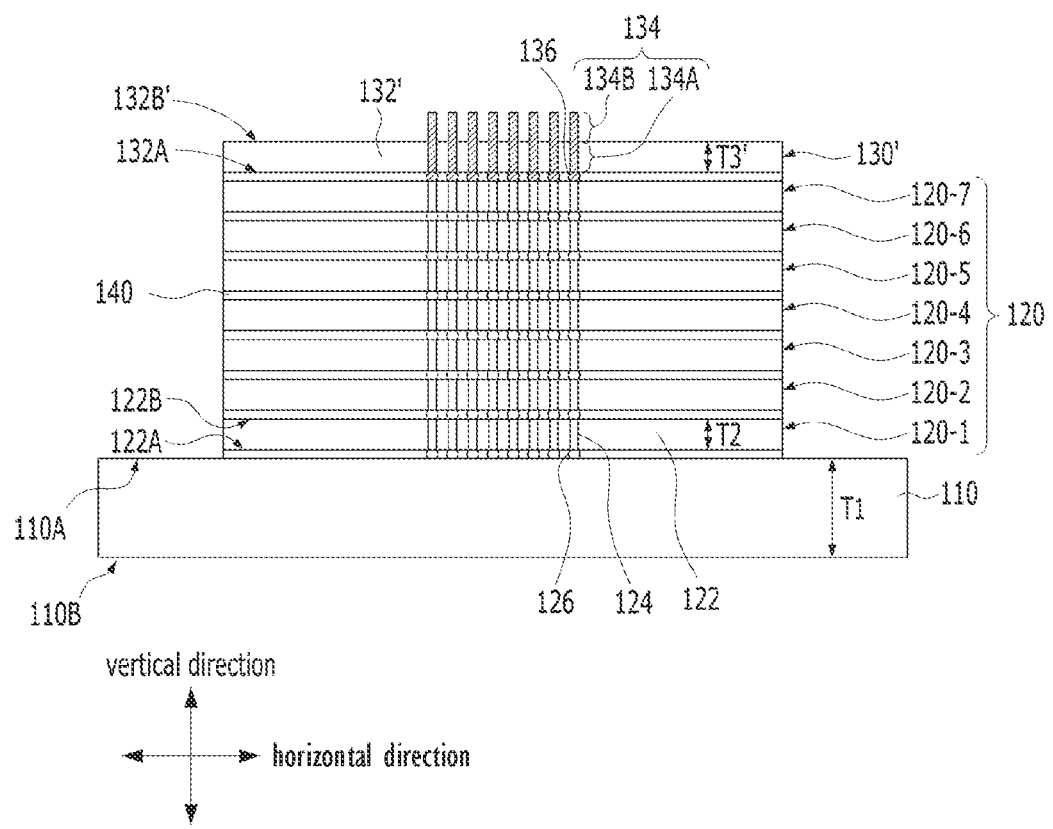
Figure 1D:
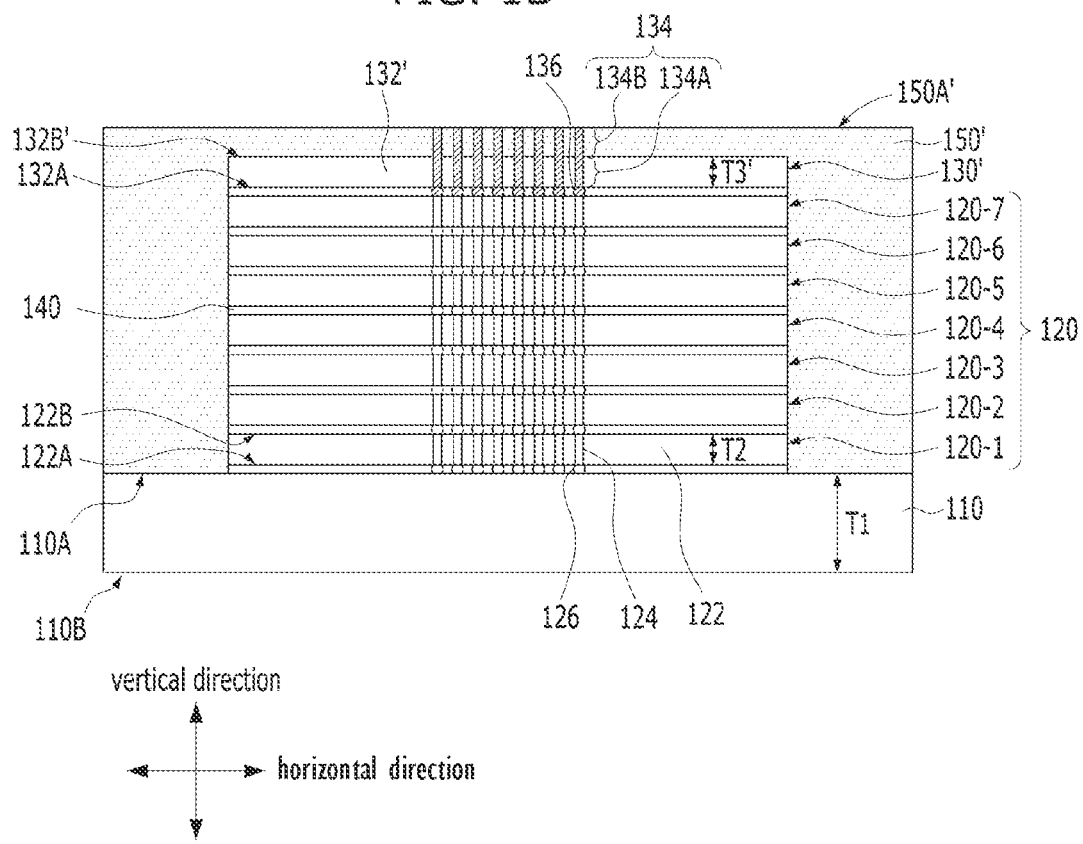
Figure 1E:
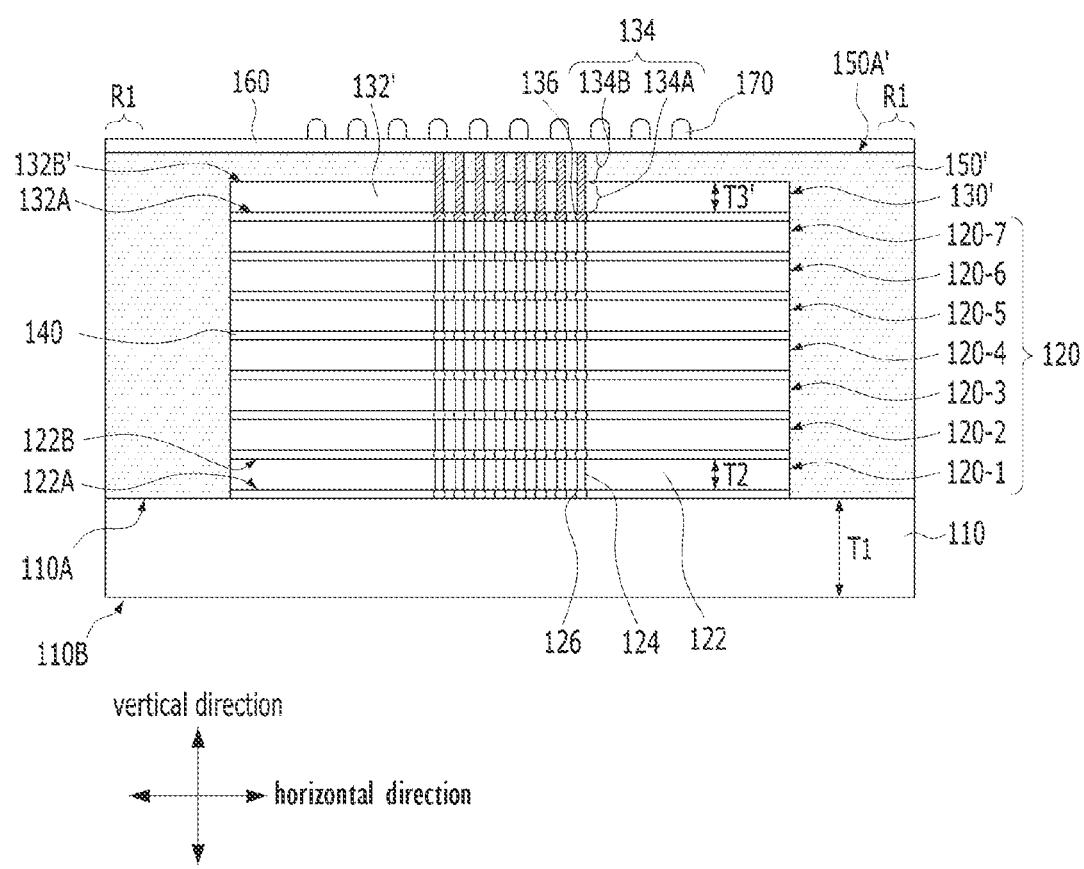
Figure 1F:
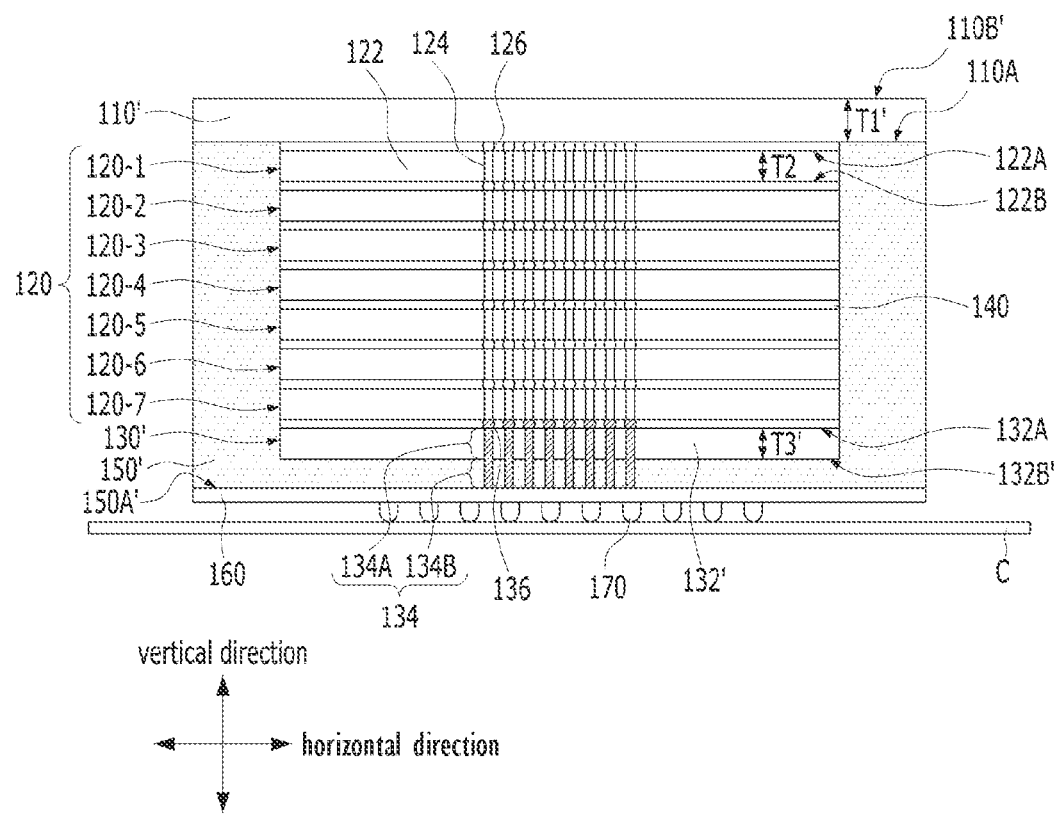

FIGS. 1A to 1F are cross-sectional views illustrating a semiconductor package according to an embodiment of the present disclosure, and a method for fabricating the same. FIG. 1F shows the semiconductor package of the present embodiment, and FIGS. 1A to 1E show intermediate process steps for fabricating the semiconductor package of FIG. 1F.

First, the fabricating method will be described.

Referring to FIG. 1A, a semiconductor wafer 110 having a first surface 110A and a second surface 110B positioned opposite to the first surface 110A may be provided.

The semiconductor wafer 110 may be in a state before processing such as thinning or dicing is performed. The thickness of the semiconductor wafer 110 before thinning is performed is indicated by reference numeral T1. In this process step, the first surface 110A may correspond to an upper surface and the second surface 110B may correspond to a lower surface. However, the upper and lower surfaces may be changed depending on how the semiconductor wafer 110 is disposed. In the following description, upper, lower, left, and right positions may be relative, not absolute.

As an example, the semiconductor wafer 110 may be in a state in which a circuit and/or wiring structure (not shown) is formed. The semiconductor wafer 110 may include a circuit and/or wiring structure identical to a circuit or wiring structure of each of a plurality of first semiconductor chips 120-1, 120-2, 120-3, 120-4, 120-5, 120-6, 120-6, and 120-7 of a first semiconductor chip stack 120, which will be described later. In this case, a semiconductor chip formed by processing the semiconductor wafer 110 may be a chip of substantially the same type as each of the first semiconductor chips 120-1 to 120-7. For example, when each of the first semiconductor chips 120-1 to 120-7 is a memory chip, the semiconductor wafer 110 may be processed to form the same memory chip.

Alternatively, as another example, the semiconductor wafer 110 might not include a meaningful circuit and/or wiring structure. That is, the semiconductor wafer 110 may be a dummy wafer that is not related to performing electrical functions.

Subsequently, a first semiconductor chip stack 120 may be formed over the first surface 110A of the semiconductor wafer 110.

The first semiconductor chip stack 120 may include a plurality of first semiconductor chips 120-1 to 120-7 that are stacked in a vertical direction. In the present embodiment, seven first semiconductor chips 120-1 to 120-7 are stacked, but the present disclosure is not limited thereto, and the number of first semiconductor chips that are included in the first semiconductor chip stack 120 may be variously modified. For convenience of description, the first semiconductor chip closest to the semiconductor wafer 110 is indicated by reference numeral 120-1, and the first semiconductor chip furthest from the semiconductor wafer 110 is indicated by reference numeral 120-7.

Each of the first semiconductor chips 120-1 to 120-7, which is in a state in which processing such as thinning and dicing has been completed, may be stacked over the semiconductor wafer 110.

Each of the first semiconductor chips 120-1 to 120-7 may include a first body portion 122, a first through electrode 124, and a first connection electrode 126.

The first body portion 122 may include a first surface 122A facing the first surface 110A of the semiconductor wafer 110, a second surface 122B located opposite to the first surface 122A, and a side surface connecting the first surface 122A and the second surface 122B. Accordingly, in this process step, the first surface 122A may correspond to a lower surface and the second surface 122B may correspond to an upper surface. The thickness of the first body portion 122 is indicated by reference numeral T2. This thickness T2 may be smaller than the thickness T1 of the semiconductor wafer 110. The planar areas of the first body portions 122 of the first semiconductor chips 120-1 to 120-7 may be the same as each other. Further, the side surfaces of the first body portions 122 of the first semiconductor chips 120-1 to 120-7 may be aligned with each other.

Although not shown, the first body portion 122 may include a semiconductor body such as silicon, and an integrated circuit formed in the semiconductor body and having various functions. The integrated circuit may be variously implemented according to the type of the first semiconductor chips 120-1 to 120-7. For example, when the first semiconductor chips 120-1 to 120-7 are memory chips, the integrated circuit may include a memory array including a plurality of memory cells. The first semiconductor chips 120-1 to 120-7 may include volatile memory such as dynamic random access memory (DRAM) and static random access memory (SRAM), or nonvolatile memory such as NAND flash memory, resistive random access memory (RRAM), phase-change random access memory (PRAM), magneto-resistive random access memory (MRAM), and ferroelectric random access memory (FRAM).

The first through electrode 124 may extend in the vertical direction to penetrate the first body portion 122 and may have a pillar shape. In the vertical direction, one end, for example, a lower end of the first through electrode 124 may be exposed to be positioned at substantially the same level as the first surface 122A, and the other end, for example, an upper end of the first through electrode 124 may be exposed to be positioned at substantially the same level as the second surface 122B. When the first body portion 122 includes a silicon body, the first through electrode 124 may include a TSV (Through Silicon Via). The number and arrangement of the first through electrodes 124 included in each of the first semiconductor chips 120-1 to 120-7 may be variously modified. The first through electrode 124 may include a metal such as copper (Cu), tin (Sn), silver (Ag), tungsten (W), nickel (Ni), ruthenium (Ru), and cobalt (Co), or a compound thereof.

The first connection electrode 126 may be formed over the first surface 122A of the first body portion 122 of each of the first semiconductor chips 120-1 to 120-7 to be connected to the one end of the first through electrode 124. Further, the first connection electrode 126, which is connected to the one end of the first through electrode 124 of each of the first semiconductor chips 120-1 to 120-7, may be connected to the other end of the first through electrode 124 of one of the first semiconductor chips 120-1 to 120-6, which is immediately lying thereunder, or the semiconductor wafer 110. In this figure, the first connection electrode 126 is in direct contact with the other end of the first through electrode 124 located thereunder and the one end of the first through electrode 124 located thereover, in the vertical direction. However, the present disclosure is not limited thereto, and when each of the first semiconductor chips 120-1 to 120-7 further includes a redistribution layer (not shown) that is formed over the first surface 122A or the second surface 122B of the first body portion 122, the first connection electrode 126 may be electrically connected to the first through electrode 124 via the redistribution layer.

The number and arrangement of the first connection electrodes 126 may be substantially the same as the number and arrangement of the first through electrodes 124. The first connection electrode 126 may be, as an example, a conductive bump. In particular, the first connection electrode 126 may include a solder material that can be bonded to the first through electrode 124. However, the present disclosure is not limited thereto, and the first connection electrode 126 may include various metal materials, solder materials, or a combination thereof. In addition, the first connection electrode 126 may have various shapes such as a pillar shape, a ball shape, or a combination thereof.

Accordingly, electrical connection between the plurality of first semiconductor chips 120-1 to 120-7 may be possible through the first through electrodes 124 and the first connection electrodes 126. Further, when the semiconductor wafer 110 includes a circuit and/or a wiring structure, electrical connection between the plurality of first semiconductor chips 120-1 to 120-7 and the semiconductor wafer 110 may also be possible.

Subsequently, an initial second semiconductor chip 130 may be formed over the first semiconductor chip stack 120. The initial second semiconductor chip 130 may be in a state in which processing, excluding thinning, is completed.

The initial second semiconductor chip 130 may include an initial second body portion 132, a second through electrode 134, and a second connection electrode 136.

The initial second body portion 132 may include a first surface 132A facing the first surface 110A of the semiconductor wafer 110, an initial second surface 132B positioned opposite to the first surface 132A, and a side surface connecting the first surface 132A and the initial second surface 132B. Accordingly, in this process step, the first surface 132A may correspond to a lower surface and the initial second surface 132B may correspond to an upper surface. The thickness of the initial second body portion 132 is indicated by reference numeral T3. This thickness T3 may be greater than the thickness T2 of the first body portion 122. The planar area of the initial second body portion 132 may be substantially the same as the planar area of the first body portion 122. Further, the side surface of the initial second body portion 132 may be aligned with the side surfaces of the first body portions 122.

Although not shown, the initial second body portion 132 may include a semiconductor body, such as silicon, and an integrated circuit formed in the semiconductor body and having various functions. The integrated circuit may be implemented in various ways depending on the type of the initial second semiconductor chip 130. For example, when the first semiconductor chips 120-1 to 120-7 are memory chips, the initial second semiconductor chip 130 may be a logic chip for controlling the memory chips. As an example, the initial second semiconductor chip 130 as a logic chip may perform an operation of providing data read from the first semiconductor chip stack 120 as a memory chip stack to a host (not shown), or storing data provided from the host to the first semiconductor chip stack 120. The initial second semiconductor chip 130 may include a central processing unit (CPU), a controller, an application specific integrated circuit (ASIC), an application processor (AP), or the like.

The second through electrode 134 may have a pillar shape, and may extend in the vertical direction from the first surface 132A toward the initial second surface 132B while having a thickness that does not completely penetrate the initial second body portion 132. That is, the thickness of the second through electrode 134 may be smaller than the thickness T3 of the initial second body portion 132. Accordingly, in the vertical direction, one end, for example, a lower end of the second through electrode 134 may be exposed to be positioned at substantially the same level as the first surface 132A, while the other end, for example, an upper end of the second through electrode 134 may be positioned below the initial second surface 132B and covered by the initial second body portion 132. When the initial second body portion 132 includes a silicon body, the second through electrode 134 may include a TSV. The number and arrangement of the second through electrodes 134 may be variously modified. As an example, the number and arrangement of the second through electrodes 134 may be the same as the number and arrangement of the first through electrodes 124. The second through electrode 134 may include a metal such as copper (Cu), tin (Sn), silver (Ag), tungsten (W), nickel (Ni), ruthenium (Ru), and cobalt (Co), or a compound thereof.

The second connection electrode 136 may be formed over the first surface 132A of the initial second body portion 132 of the initial second semiconductor chip 130 to be connected to the one end of the second through electrode 134. In addition, the second connection electrode 136 may be connected to the other end of the first through electrode 124 of the first semiconductor chip 120-7 immediately lying thereunder. In this figure, the second connection electrode 136 is in direct contact with the one end of the second through electrode 134 positioned thereover and the other end of the first through electrode 124 positioned thereunder, in the vertical direction. However, the present disclosure is not limited thereto, and when a redistribution layer (not shown) is further formed over the first surface 132A of the initial second body portion 132 and/or the second surface 122B of the first body portion 122 of the first semiconductor chip 120-7, the second connection electrode 136 and the second through electrode 134 and/or the first through electrode 124 of the first semiconductor chip 120-7 may be electrically connected via the redistribution layer. The number and arrangement of the second connection electrodes 136 may be substantially the same as the number and arrangement of the first through electrodes 124 and the number and arrangement of the second through electrodes 134. The second connection electrode 136 may be, as an example, a conductive bump. In particular, the second connection electrode 136 may include a solder material that can be bonded to the first through electrode 124 and the second through electrode 134. However, the present disclosure is not limited thereto, and the second connection electrode 136 may include various metal materials, solder materials, or a combination thereof. In addition, the second connection electrode 136 may have various shapes such as a pillar shape, a ball shape, or a combination thereof.

As a result, electrical connection between the first semiconductor chip stack 120 and the initial second semiconductor chip 130 may be possible.

Spaces between the semiconductor wafer 110 and the first semiconductor chip 120-1, between the first semiconductor chips 120-1 to 120-7, and between the first semiconductor chip 120-7 and the initial second semiconductor chip 130 may be filled with a filling material 140 such as an underfill.

Meanwhile, although not shown, two or more stacked structures, each stacked structure including the first semiconductor chip stack 120 and the initial second semiconductor chip 130, may be formed over the semiconductor wafer 110. In this case, the two or more stacked structures 120 and 130 may be formed to be spaced apart from each other in a horizontal direction. The two or more stacked structures 120 and 130 may be separated from each other by a dicing process to be described later to form one package.

Referring to FIG. 1B, by removing a part of the initial second body portion 132 from the initial second surface 132B of the initial second semiconductor chip 130 of FIG. 1A to a surface indicated by a dotted line, a second body portion 132' having a second surface 132B' that is lower than the initial second surface 132B may be formed. The thickness of the second body portion 132' is indicated by reference numeral T3'. This thickness T3' may be smaller than the thickness T1 of the semiconductor wafer 110.

The process of forming the second body portion 132' may be performed using an etching method such as dry etching. For reference, the removed part of the initial second body portion 132 might not include a circuit and/or a wiring structure. That is, the removed part of the initial second body portion 132 may include only a semiconductor material such as silicon.

During the process of forming the second body portion 132', the second through electrode 134 may be substantially maintained. That is, the second through electrode 134 might not be lost or may be lost to a very small extent. This may be possible by performing etching under a condition in which an etching selectivity of a semiconductor material to a metal is high during the process of forming the second body portion 132'. As a result, the second through electrode 134 may protrude over the second surface 132B' of the second body portion 132' while penetrating the second body portion 132'. A portion of the second through electrode 134 that is buried in the second body portion 132' and penetrates the second body portion 132' will be referred to as a through portion 134A, and a portion of the second through electrode 134 that protrudes over the second body portion 132' will be referred to as a protruding portion 134B.

Accordingly, a second semiconductor chip 130' including the second body portion 132', the second through electrode 134, and the second connection electrode 136 may be formed.

Meanwhile, in the present embodiment, the process of FIG. 1B is performed after the process of FIG. 1A, that is, after the initial second semiconductor chip 130 is stacked over the first semiconductor chip stack 120, but the present disclosure is not limited thereto. In another embodiment, after forming the second semiconductor chip 130' of FIG. 1B, the second semiconductor chip 130' may be stacked over the first semiconductor chip stack 120.

Referring to FIG. 1C, an initial molding layer 150 covering a stacked structure of the first semiconductor chip stack 120 and the second semiconductor chip 130' may be formed over the first surface 110A of the semiconductor wafer 110.

The initial molding layer 150 may be formed to surround the side surfaces of the first semiconductor chip stack 120 and the second semiconductor chip 130', and cover the second through electrode 134 of the second semiconductor chip 130'. Accordingly, the initial molding layer 150 may have one surface 150A positioned at a higher level than the other end of the second through electrode 134 in the vertical direction. The initial molding layer 150 may include a molding material such as EMC (Epoxy Molding Compound).

Referring to FIG. 1D, a molding layer 150' may be formed by removing a part of the initial molding layer 150 so that the other end of the second through electrode 134 is exposed. As a result, the one surface 150A of the initial molding layer 150 shown in FIG. 1C may be lowered to be positioned at substantially the same level as the other end of the second through electrode 134, and accordingly, the other end of the second through electrode 134 may be exposed. The lowered one surface is indicated by reference numeral 150A'. This one surface 150A' may form a flat surface with the other end of the second through electrode 134.

The molding layer 150' may be formed by grinding, chemical mechanical polishing (CMP), or the like.

Referring to FIG. 1E, a package redistribution layer 160 and an external connection electrode 170 may be formed over the one surface 150A' of the molding layer 150'.

The package redistribution layer 160 may be to provide electrical connection between the second through electrode 134 of the second semiconductor chip 130' and the external connection electrode 170. Although not shown, the package redistribution layer 160 may include various types of conductive patterns and insulating layers in which these conductive patterns are buried. One end of the conductive patterns of the package redistribution layer 160 may be connected to the other end of the second through electrode 134, and the other end of the conductive patterns of the package redistribution layer 160 may be connected to the external connection electrode 170. The package redistribution layer 160 may be distinguished from the redistribution layer (not shown) included in the first semiconductor chips 120-1 to 120-7 and/or the second semiconductor chip 130' described above.

The external connection electrode 170 may be for connecting the semiconductor package of the present embodiment with an external component, and may include various electrical interconnectors such as solder balls, conductive bumps, or a combination thereof.

The package redistribution layer 160 may be omitted. In this case, the external connection electrode 170 may directly contact the other end of the second through electrode 134. When the external connection electrode 170 directly contacts the other end of the second through electrode 134, unlike the illustration, the external connection electrodes 170 may have the same arrangement as the second through electrodes 134.

Referring to FIG. 1F, after attaching the external connection electrode 170 to a carrier C such as a tape or an insulating film, the resultant structure of FIG. 1E may be reversed. As a result, as shown in FIG. 1F, the upper and lower positions of the components of FIG. 1E may be reversed.

Subsequently, a thinning process and a dicing process may be performed on the resultant structure of FIG. 1E.

For example, the thinning process may be performed so that the semiconductor package of the present embodiment has a desired thickness, that is, to be thinned to a target thickness. Because the semiconductor wafer 110 is located at the uppermost portion in this process step, the thinning process may be performed on a part of the semiconductor wafer 110 from the second surface (see 110B in FIG. 1E) of the semiconductor wafer 110. The thinning process may be performed by grinding, CMP, etching, or the like. In addition, when the semiconductor wafer 110 includes a circuit and/or wiring structure, the part of the semiconductor wafer 110, which has been removed by the thinning process, might not include the circuit and/or wiring structure. That is, the part of the semiconductor wafer 110, which has been removed by the thinning process, may include only a semiconductor material such as silicon.

In addition, the dicing process may be for separating the stacked structure of the first semiconductor chip stack 120 and the second semiconductor chip 130' from an adjacent stacked structure (not shown). The dicing process may be performed by removing the semiconductor wafer 110, the molding layer 150', and the package redistribution layer 160 in a region between two adjacent stacked structures 120 and 130' (see R1 in FIG. 1E), using laser sawing.

The thinned and diced semiconductor wafer 110 will be hereinafter referred to as a third semiconductor chip 110'. The thickness T1' of the third semiconductor chip 110' may be smaller than the thickness T1 of the semiconductor wafer 110. In addition, the thickness T1' of the third semiconductor chip 110' may be the same as/similar to the thickness T2 of each of the first semiconductor chips 120-1 to 120-7 and/or the thickness T3' of the second semiconductor chip 130'. The planar area of the third semiconductor chip 110' may be greater than the planar area of each of the first semiconductor chips 120-1 to 120-7 and the planar area of the second semiconductor chip 130'. A side surface of the third semiconductor chip 110' may be aligned with a side surface of the diced molding layer 150' and a side surface of the diced package redistribution layer 160.

As described above, the third semiconductor chip 110' may be a semiconductor chip of the same type as each of the first semiconductor chips 120-1 to 120-7, for example, a memory chip, or a dummy semiconductor chip.

Although not shown, the carrier C may be removed after the thinning process and the dicing process. Thus, the semiconductor package of the present embodiment may be obtained. The semiconductor package of the present embodiment will be described with reference to FIG. 1F again. In this case, detailed descriptions of the parts already described in the above-described fabricating method will be omitted.

Referring again to FIG. 1F, the semiconductor package of the present embodiment may include the second semiconductor chip 130', the first semiconductor chip stack 120 including the plurality of first semiconductor chips 120-1 to 120-7 which are disposed over the second semiconductor chip 130' and stacked in the vertical direction, the molding layer 150' surrounding the side surfaces of the first semiconductor chip stack 120 and the second semiconductor chip 130', and the third semiconductor chip 110' disposed over the molding layer 150' and the first semiconductor chip stack 120.

The first semiconductor chips 120-1 to 120-7 may be memory chips, and the second semiconductor chip 130' may be a logic chip. The third semiconductor chip 110' may be the same memory chip as the first semiconductor chips 120-1 to 120-7 or may be a dummy semiconductor chip.

Here, the planar area of the third semiconductor chip 110' may be greater than the planar area of each of the first semiconductor chips 120-1 to 120-7 and the planar area of the second semiconductor chip 130'. For this reason, the third semiconductor chip 110' may overlap the first semiconductor chip stack 120 and the second semiconductor chip 130', and may also overlap the molding layer 150' that surrounds the side surfaces of the first semiconductor chip stack 120 and the second semiconductor chip 130'. The planar area of each of the first semiconductor chips 120-1 to 120-7 and the planar area of the second semiconductor chip 130' may be the same as each other, and the side surfaces thereof may be aligned with each other. Also, the side surface of the third semiconductor chip 110' and the side surface of the molding layer 150' may be aligned with each other.

The thickness T1' of the third semiconductor chip 110', the thickness T2 of the first body portion 122 of each of the first semiconductor chips 120-1 to 120-7, and the thickness T3' of the second body portion 132' of the second semiconductor chip 130' may have the same or similar value.

The second semiconductor chip 130' and the first semiconductor chips 120-1 to 120-7 may be electrically connected to each other through the first through electrode 124, the first connection electrode 126, the second through electrode 134, and the second connection electrode 136. Further, the third semiconductor chip 110' may be electrically connected to the first semiconductor chip stack 120 and the second semiconductor chip 130' through the first through electrode 124, the first connection electrode 126, the second through electrode 134, and the second connection electrode 136.

The second through electrode 134 of the second semiconductor chip 130' may include the through portion 134A penetrating through the second body portion 132', and the protruding portion 134B that is integrally connected to the through portion 134A and protrudes downward further than the second surface 132B' of the second body portion 132'. The molding layer 150' may surround the side surface of the protruding portion 134B of the second through electrode 134 while covering the second surface 132B' of the second body portion 132'.

The other end of the second through electrode 134, for example, a lower end of the protruding portion 134B, may be exposed by the molding layer 150', and may be connected to the external connection electrode 170 via the package redistribution layer 160, or directly.

The semiconductor package of the present embodiment may be electrically connected to an external component (not shown), for example, another semiconductor package, another semiconductor chip, a semiconductor substrate such as a printed circuit board (PCB), or the like, using the external connection electrode 170.

According to the above-described semiconductor package and its fabricating method, the following advantages may be obtained.

First, because the first semiconductor chip stack 120 and the second semiconductor chip 130' are stacked over the thick semiconductor wafer 110, problems occurring in a comparative example in which a memory chip stack is formed over a thin logic wafer, may be solved. According to the comparative example, because the memory chip stack is formed over the thin logic wafer, and then a molding layer forming process, a thinning process, a dicing process, or the like, are performed, mechanical damage may be applied to the logic wafer, and thus defects such as cracking and chipping of the logic wafer may occur. In addition, a process of forming the memory chip stack may be difficult due to warpage of the thin logic wafer. On the other hand, according to the present embodiment, because the thick semiconductor wafer 110 is used, the occurrence of defects such as cracking and chipping of the semiconductor wafer 110 may be reduced, and the warpage of the semiconductor wafer 110 may be mitigated to facilitate a process of forming the semiconductor chip stack 120 and the second semiconductor chip 130'. In addition, because the second semiconductor chip 130' that can be used as a logic chip is formed over the first semiconductor chip stack 120, direct dicing for the second semiconductor chip 130' might not be performed. Therefore, cracking or chipping of the second semiconductor chip 130' might not occur.

In addition, by performing the thinning process on the semiconductor wafer 110, it may be possible to obtain the third semiconductor chip 110' and/or the semiconductor package having a desired thin thickness.

In addition, because the semiconductor package includes the stacked structure of the plurality of first semiconductor chips 120-1 to 120-7, it may be possible to obtain a high integration/high capacity semiconductor package. In addition, because the semiconductor package includes the first semiconductor chip stack 120 and the second semiconductor chip 130' that have different functions, it may be possible to obtain a multifunctional semiconductor package. For example, it may be possible to implement an SIP (System in Package).

Furthermore, because the first semiconductor chip stack 120 and the second semiconductor chip 130' are surrounded by the molding layer 150' and the third semiconductor chip 110', it may be possible to mitigate damage to the semiconductor package in a subsequent process. For example, damage to the first semiconductor chip stack 120 and the second semiconductor chip 130' during the above-described dicing process may be mitigated. In addition, for example, when the semiconductor package of the present embodiment is transported, damage to the semiconductor package may be mitigated.

FIGS. 2A to 2F are cross-sectional views illustrating a semiconductor package according to another embodiment of the present disclosure, and a method for fabricating the same. It will be described focusing on differences from the above-described embodiment.

Figure 2A:
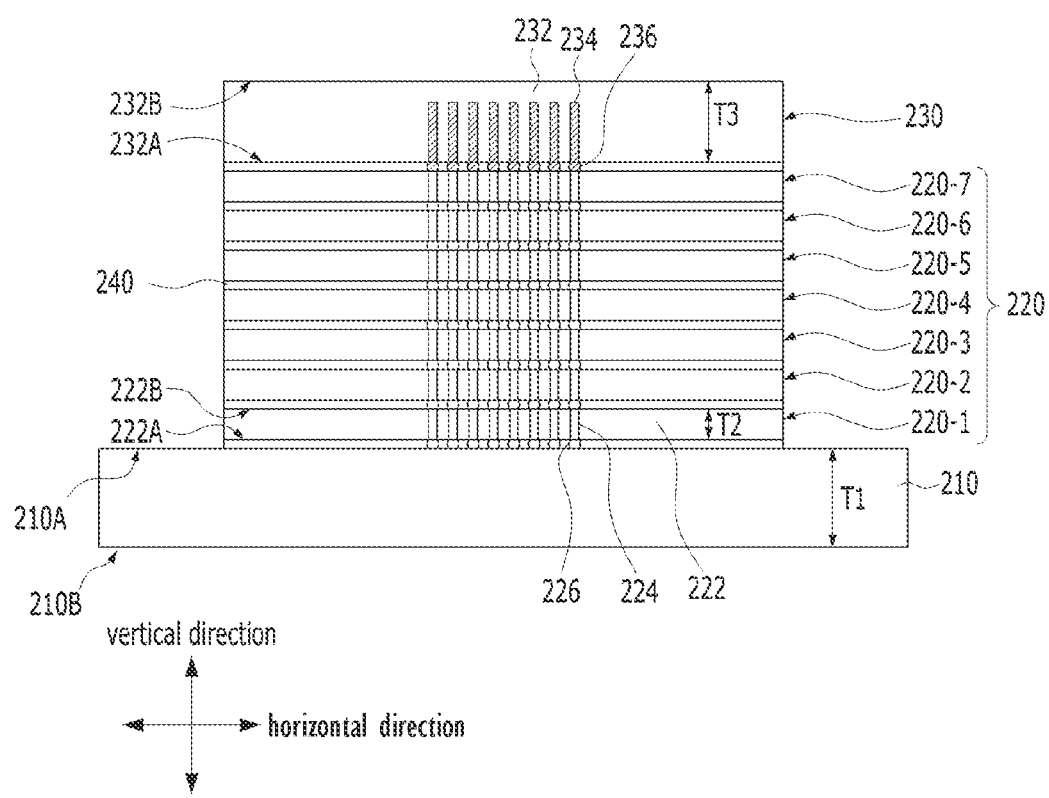
FIGS. 2A, 2B, 2C, 2D, 2E, and 2F are cross-sectional views illustrating a semiconductor package according to another embodiment of the present disclosure, and a method for fabricating the same.

Referring to FIG. 2A, a semiconductor wafer 210 having a first surface 210A and a second surface 210B may be provided. The thickness of the semiconductor wafer 210 is indicated by reference numeral T1.

Subsequently, a first semiconductor chip stack 220 including a plurality of first semiconductor chips 220-1 to 220-7 stacked in a vertical direction, may be formed over the first surface 210A of the semiconductor wafer 210. Each of the first semiconductor chips 220-1 to 220-7 may include a first body portion 222 having a first surface 222A and a second surface 222B, a first through electrode 224, and a first connection electrode 226. The thickness of the first body portion 222 is indicated by reference numeral T2.

Subsequently, an initial second semiconductor chip 230 may be formed over the first semiconductor chip stack 220. The initial second semiconductor chip 230 may include an initial second body portion 232 having a first surface 232A and an initial second surface 232B, an initial second through electrode 234, and a second connection electrode 236. The thickness of the initial second body portion 232 is indicated by reference numeral T3.

Spaces between the semiconductor wafer 210 and the first semiconductor chip 220-1, between the first semiconductor chips 220-1 to 220-7, and between the first semiconductor chip 220-7 and the initial second semiconductor chip 230 may be filled with a filling material 240 such as an underfill.

Figure 2B:
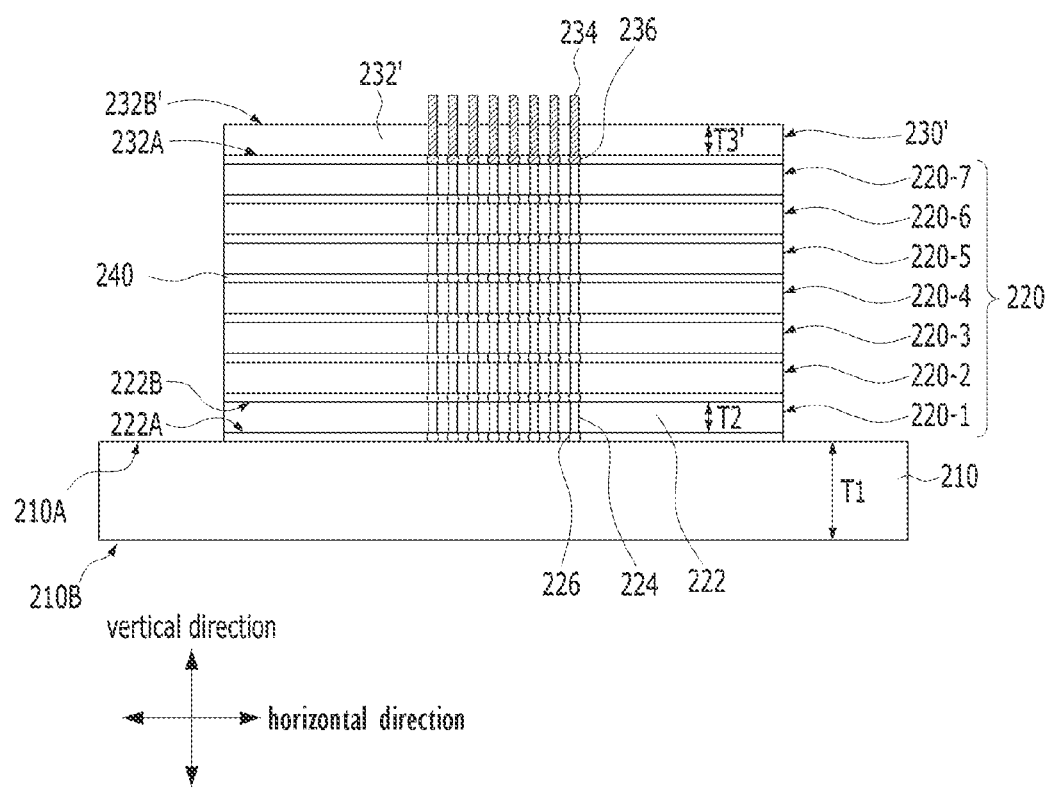

Referring to FIG. 2B, by removing a part of the initial second body portion 232 from the initial second surface 232B of the initial second semiconductor chip 230 of FIG. 2A, a second body portion 232' having a second surface 232B' that is lowered than the initial second surface 232B, may be formed. The thickness of the second body portion 232' is indicated by reference numeral T3'. Accordingly, the initial second through electrode 234 may protrude over the second surface 232B' of the second body portion 232' while penetrating the second body portion 232'.

As a result, an intermediate second semiconductor chip 230' including the second body portion 232', the initial second through electrode 234, and the second connection electrode 236, may be formed.

Figure 2C:
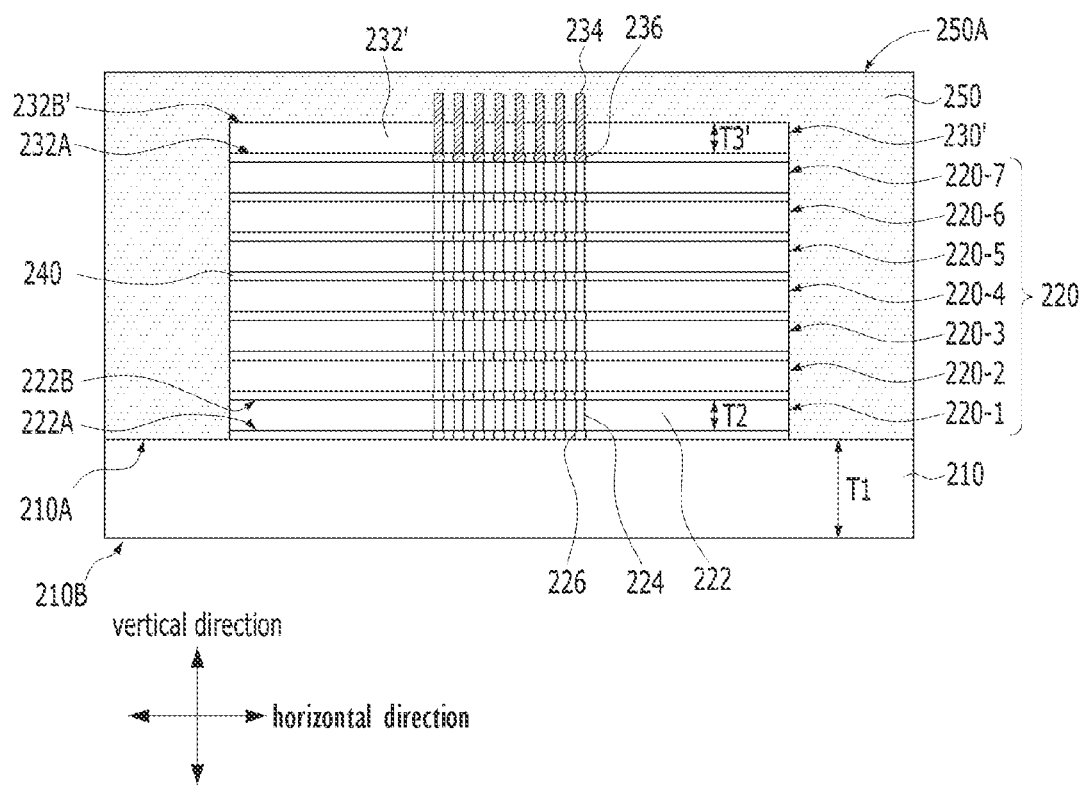

Referring to FIG. 2C, an initial molding layer 250 may be formed over the first surface 210A of the semiconductor wafer 210 to cover the stacked structure of the first semiconductor chip stack 220 and the intermediate second semiconductor chip 230'.

The initial molding layer 250 may surround the side surfaces of the first semiconductor chip stack 220 and the intermediate second semiconductor chip 230', and may cover the second through electrode 234 of the intermediate second semiconductor chip 230'. Accordingly, the initial molding layer 250 may have one surface 250A positioned at a higher level than the other end of the second through electrode 234 in the vertical direction.

Figure 2D:
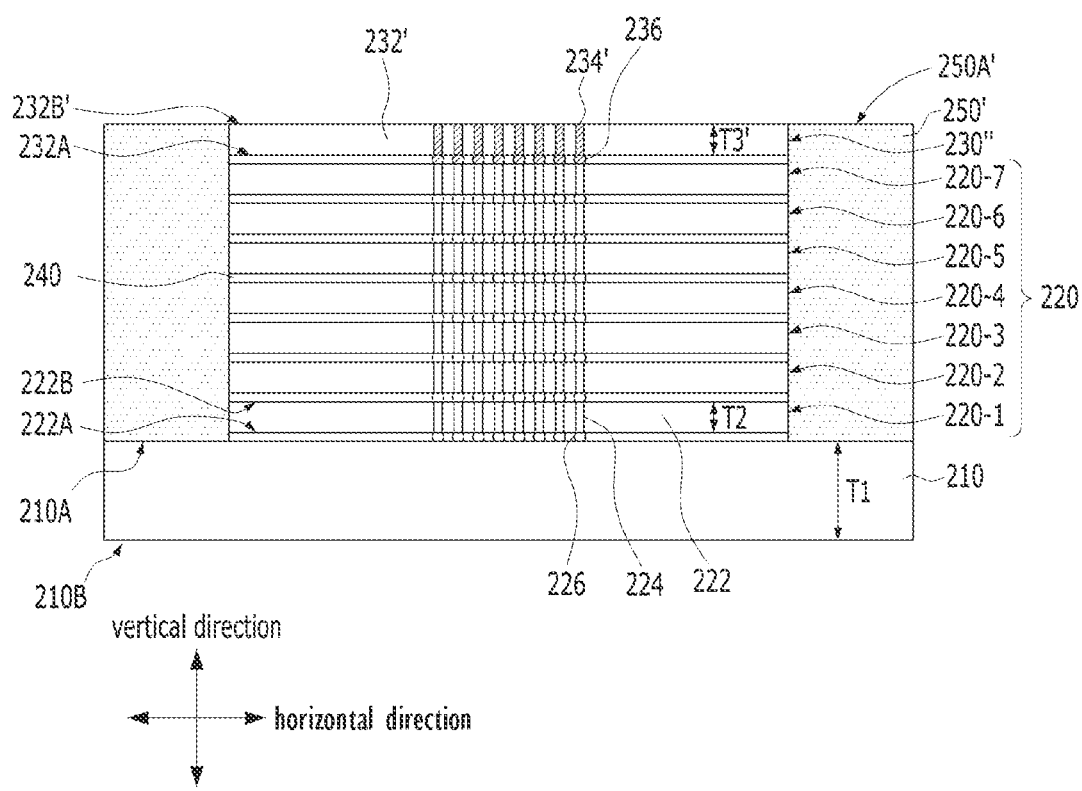

Referring to FIG. 2D, a planarization process, such as grinding or CMP, may be performed so that the second surface 232B' of the second body portion 232' is exposed. As a result, the protruding portion of the initial second through electrode 234 may be removed to form a second through electrode 234' that is buried in the second body portion 232' while penetrating the second body portion 232'. In the vertical direction, one end of the second through electrode 234' may be exposed to be positioned at substantially the same level as the first surface 232A of the second body portion 232', and the other end of the second through electrode 234' may be exposed to be positioned at substantially the same level as the second surface 232B' of the second body portion 232'. In addition, the one surface 250A of the initial molding layer 250 shown in FIG. 2C may be lowered to be positioned at substantially the same level as the other end of the second through electrode 234' and the second surface 232B' of the second body portion 232'. The lowered one surface is indicated by reference numeral 250A'. The one surface 250A' may form a flat surface with the other end of the second through electrode 234' and the second surface 232B' of the second body portion 232'.

As a result, a second semiconductor chip 230" including the second body portion 232', the second through electrode 234', and the second connection electrode 236, may be formed.

Meanwhile, a process sequence or method for obtaining the resultant structure of FIG. 2D may be variously modified. As an example, after forming the intermediate second semiconductor chip 230' of FIG. 2B, the intermediate second semiconductor chip 230' may be stacked over the first semiconductor chip stack 220, and then, the processes of FIGS. 2C and 2D may be performed. Alternatively, as another example, after the process of FIG. 2A, the process of FIG. 2B may be omitted, and then, the process of forming the molding layer 250 of FIG. 2C and the planarization process of the molding layer 250 of FIG. 2D may be performed.

Figure 2E:
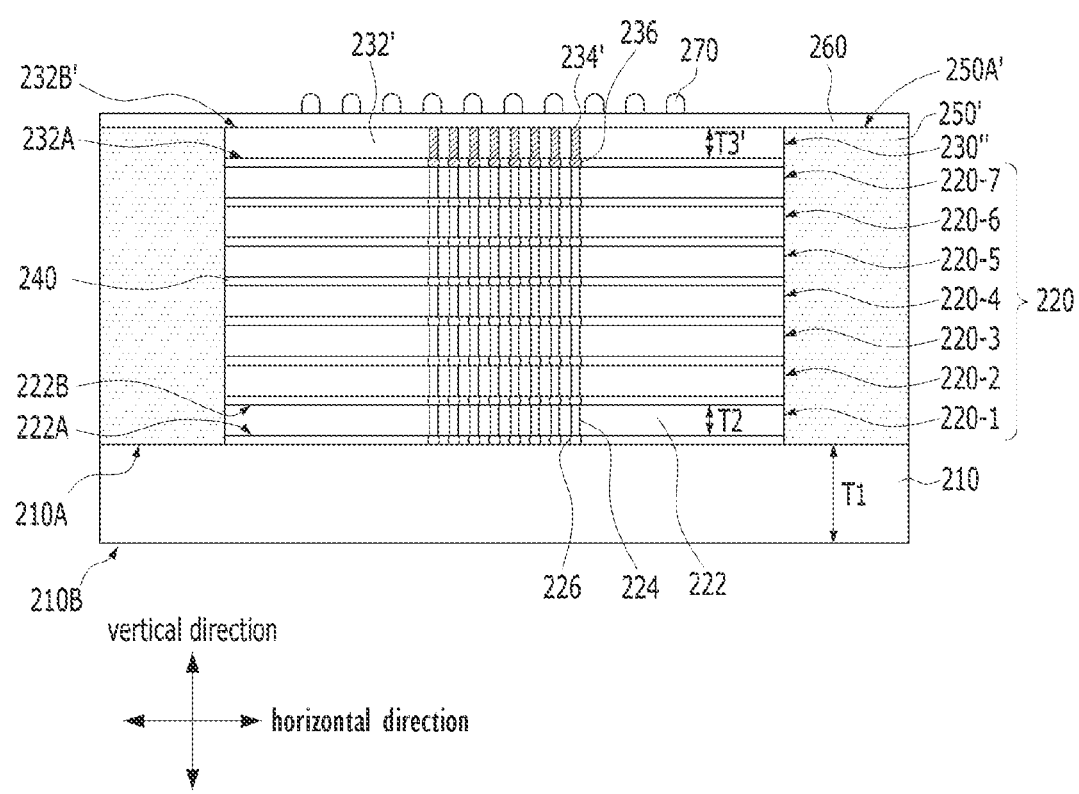

Referring to FIG. 2E, a package redistribution layer 260 and an external connection electrode 270 may be formed over the one surface 250A' of the molding layer 250'.

Figure 2F:
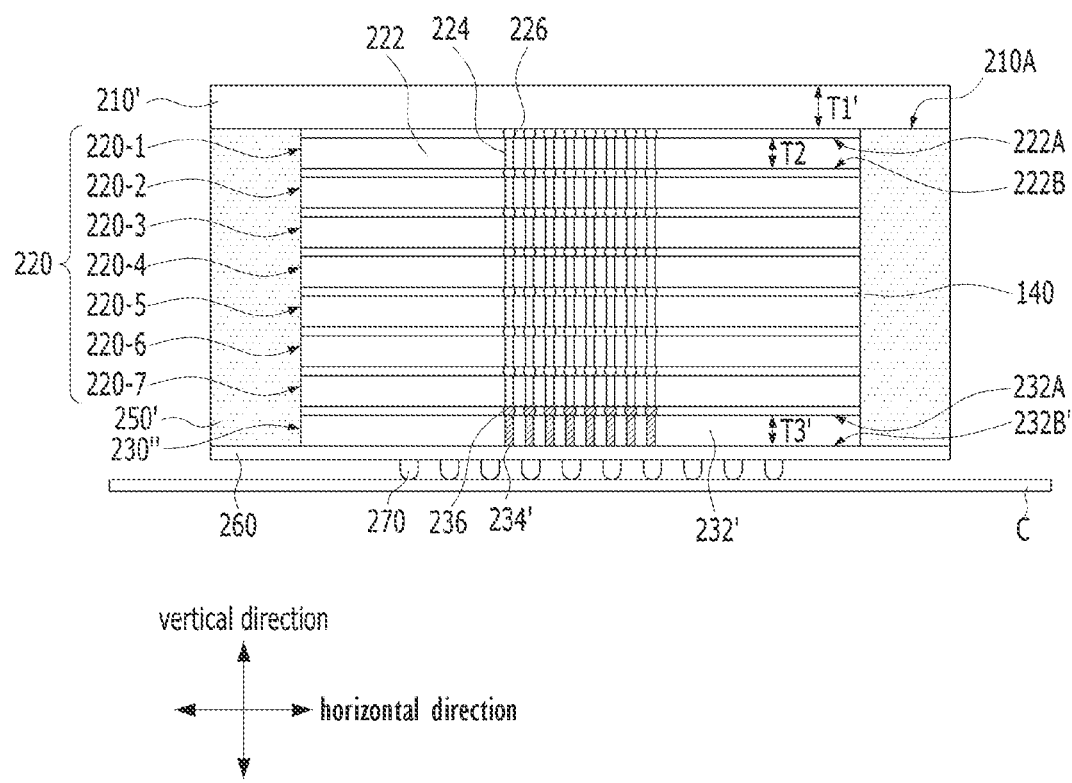

Referring to FIG. 2F, after attaching the external connection electrode 270 to a carrier C, the resultant structure of FIG. 2E may be reversed. As a result, as shown in FIG. 2F, the upper and lower positions of the components of FIG. 2E may be reversed.

Subsequently, a thinning process and a dicing process may be performed on the resultant structure of FIG. 2E.

Subsequently, although not shown, by removing the carrier C, the semiconductor package of the present embodiment may be obtained. Here, the thinned and diced semiconductor wafer 210 will be referred to as a third semiconductor chip 210'. The thickness of the third semiconductor chip 210' is indicated by reference numeral T1'.

Referring again to FIG. 2F, the semiconductor package of the present embodiment may include the second semiconductor chip 230", the first semiconductor chip stack 220 including the plurality of first semiconductor chips 220-1 to 220-7 that are disposed over the second semiconductor chip 230" and stacked in the vertical direction, the molding layer 250' surrounding the side surfaces of the first semiconductor chip stack 220 and the second semiconductor chip 230", and the third semiconductor chip 210' disposed over the first semiconductor chip stack 220 and the molding layer 250'.

Here, apart from the above-described embodiment, the second through electrode 234' might not protrude outside the second body portion 232' while penetrating the second body portion 232' within the second body portion 232'. Accordingly, the other end, for example, a lower end of the second through electrode 234' may be exposed to be positioned at substantially the same level as the second surface 232B' of the second body portion 232'. In addition, the one surface 250A' of the molding layer 250' may be located at substantially the same level as the other end of the second through electrode 234' and the second surface 232B' of the second body portion 232' to expose them.

The other end of the second through electrode 234', which has been exposed, may be connected to the external connection electrode 270 via the package redistribution layer 260, or directly.

Even according to the present embodiment, it may be possible to have all the advantages of the above-described embodiment.

Meanwhile, the structure of FIG. 1D described above, that is, the structure in which the second through electrode 134 includes the protruding portion 134B protruding from the second surface 232' of the second body portion 132', and the molding layer 150' exposes the other end, for example, the upper end of the protruding portion 134B, may be variously modified. This will be described, for example, with reference to FIGS. 3A to 5G below. In these figures, only portions corresponding to the second semiconductor chip 130' and the molding layer 150' surrounding it, are illustrated for convenience.

FIGS. 3A to 3D are partial cross-sectional views illustrating a semiconductor package according to another embodiment of the present disclosure, and a method for fabricating the semiconductor package.

Figure 3A:
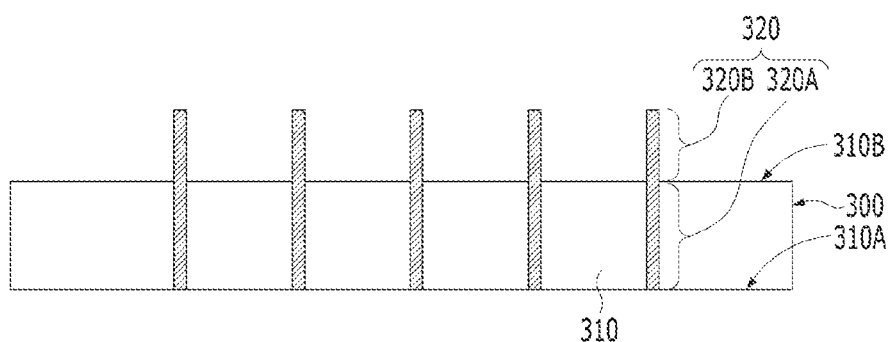
FIGS. 3A, 3B, 3C, and 3D are partial cross-sectional views illustrating a semiconductor package according to another embodiment of the present disclosure, and a method for fabricating the same.

Referring to FIG. 3A, a semiconductor chip 300 including a body portion 310 and a through electrode 320 may be provided.

The body portion 310 may include a first surface 310A and a second surface 310B positioned opposite to the first surface 310A.

The through electrode 320 may protrude over the second surface 310B of the body portion 310 while penetrating the body portion 310. A portion of the through electrode 320, which is buried in the body portion 310 and penetrates the body portion 310, will be referred to as a through portion 320A, and a portion of the through electrode 320, which protrudes over the body portion 310, will be referred to as a protruding portion 320B.

Figure 3B:
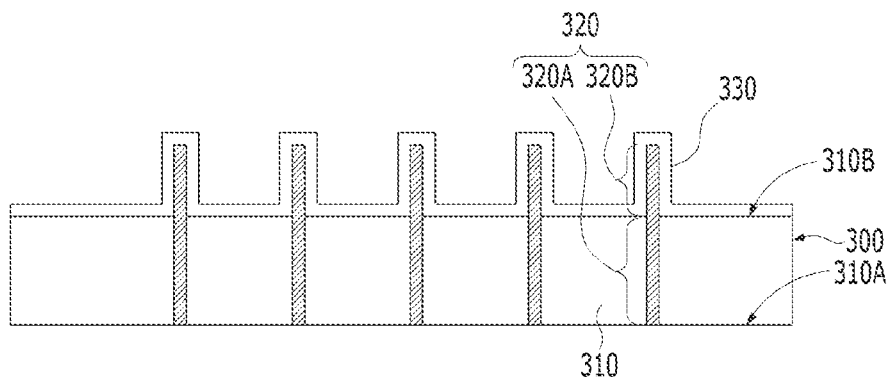

Referring to FIG. 3B, an initial protective layer 330 may be formed along its lower profile, over the second surface 310B of the body portion 310 and the protruding portion 320B of the through electrode 320.

The initial protective layer 330 may be formed using a deposition method having excellent step coverage characteristics such as chemical vapor deposition (CVD). In addition, the initial protective layer 330 may include various insulating materials such as silicon oxide, silicon nitride, or a combination thereof.

Figure 3C:
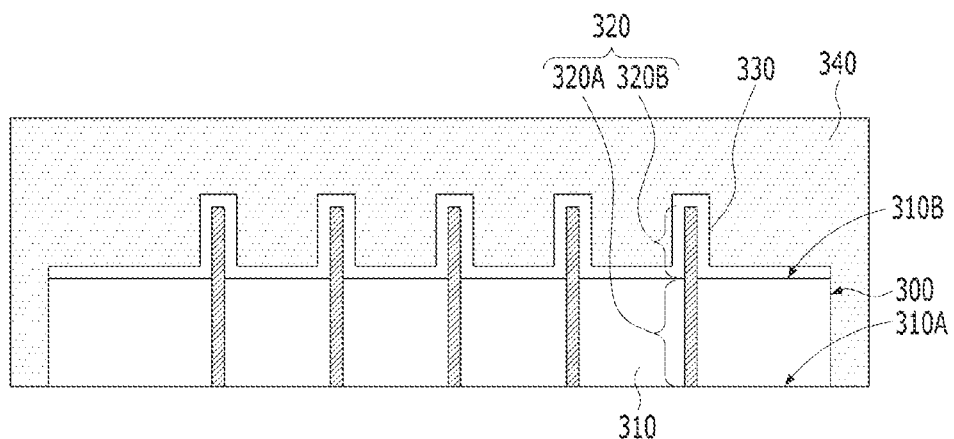

Referring to FIG. 3C, an initial molding layer 340 covering the semiconductor chip 300 may be formed.

The initial molding layer 340 may be formed to cover the initial protective layer 330 while surrounding the side surface of the semiconductor chip 300. Accordingly, the initial molding layer 340 may have an upper surface positioned at a level higher than the maximum height of the upper surface of the initial protective layer 330.

Figure 3D:
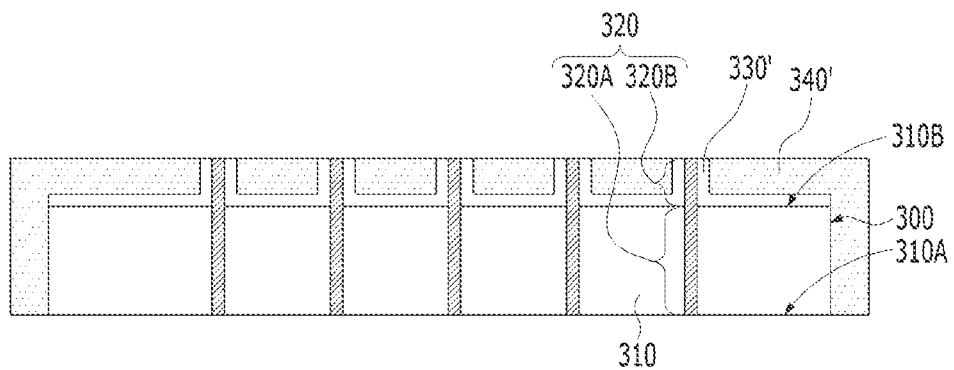

Referring to FIG. 3D, a planarization process may be performed so that the upper end of the through electrode 320, that is, the upper end of the protruding portion 320B is exposed. This planarization process may be performed using grinding, CMP, or the like.

During the planarization process, the protruding portion 320B may be substantially maintained. That is, the protruding portion 320B might not be lost or may be lost to a very small extent. However, the present disclosure is not limited thereto, and the protruding portion 320B may be lost to a predetermined degree according to a recipe of the planarization process, and the height thereof may be lowered. The word "predetermined" as used herein with respect to a parameter, such as a predetermined degree, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

As a result of this process, a part of the initial molding layer 340 and a part of the initial protective layer 330, which are located over the protruding portion 320B, may be removed to form a molding layer 340' and a protective layer 330', respectively.

The protective layer 330' may be formed along its lower profile, over the side surface of the protruding portion 320B and the second surface 310B of the body portion 310. The side and lower surfaces of the molding layer 340' between the protruding portions 320B may be surrounded by the protective layer 330'. Accordingly, the protective layer 330' may be interposed between the molding layer 340' and the side surface of the protruding portion 320B, and between the molding layer 340' and the second surface 310B of the body portion 310.

In the vertical direction, the upper surface of the molding layer 340' and the upper surface of the maximum height of the protective layer 330' may be positioned at substantially the same level as the upper end of the protruding portion 320B. That is, the upper surface of the molding layer 340', the upper surface of the maximum height of the protective layer 330', and the upper end of the protruding portion 320B may form a flat surface.

Subsequent processes may be substantially the same as those described in FIGS. 1E and 1F. That is, although not illustrated, a package redistribution layer and/or an external connection electrode connected to the upper end of the through electrode 320 may be formed over the flat surface.

The body portion 310, the through electrode 320, and the molding layer 340' of FIG. 3D may correspond to the second body portion 132', the second through electrode 134, and the molding layer 150' of FIG. 1D, respectively.

According to the present embodiment, because the protective layer 330' is further interposed between the adjacent through electrodes 320, it may be possible to mitigate the occurrence of defects due to movement of metal ions between the through electrodes 320. This is because the protective layer 330' as an insulating material mitigates movement of metal ions.

FIGS. 4A to 4F are partial cross-sectional views illustrating a semiconductor package according to another embodiment of the present disclosure, and a method for fabricating the same.

Figure 4A:
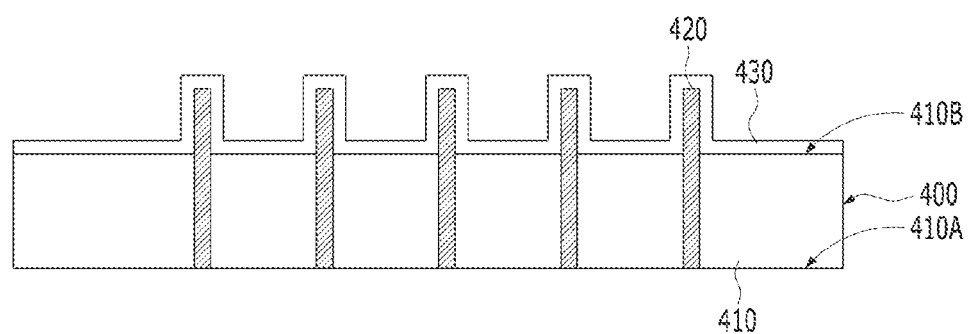
FIGS. 4A, 4B, 4C, 4D, 4E, and 4F are partial cross-sectional views illustrating a semiconductor package according to another embodiment of the present disclosure, and a method for fabricating the same.

Referring to FIG. 4A, a semiconductor chip 400 including a body portion 410 and an initial through electrode 420 may be provided.

The body portion 410 may include a first surface 410A and a second surface 410B positioned opposite to the first surface 410A. The initial through electrode 420 may protrude over the second surface 410B of the body portion 410 while penetrating the body portion 410.

Subsequently, an initial first protective layer 430 may be formed over the second surface 410B of the body portion 410 and the protruding portion of the initial through electrode 420, along its lower profile.

The initial first protective layer 430 may be formed using a deposition method having step coverage characteristics such as CVD. In addition, the initial first protective layer 430 may include various insulating materials such as silicon oxide, silicon nitride, or a combination thereof.

Figure 4B:
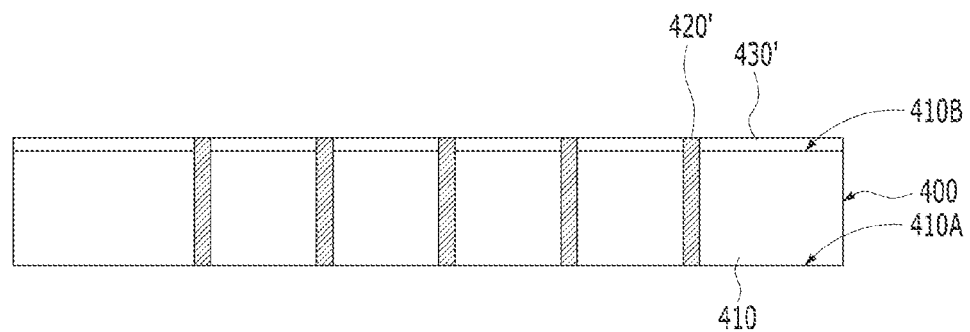

Referring to FIG. 4B, a planarization process, such as CMP, may be performed so that the protruding portion of the initial through electrode 420 is removed. This planarization process may be performed by targeting an upper surface of a part of the initial first protective layer 430, which is positioned over the second surface 410B of the body portion 410.

As a result of the present process, a first protective layer 430' positioned over the second surface 410B of the body portion 410, and a through electrode 420' penetrating the body portion 410 and the first protective layer 430', may be formed. The upper surface of the first protective layer 430' and the upper end of the through electrode 420' may be positioned at the same level in the vertical direction to form a flat surface.

However, the present disclosure is not limited thereto, and in another embodiment, the planarization process may be performed so that the second surface 410B of the body portion 410 is exposed. In this case, the initial first protective layer 430 may be removed, and the through electrode 420' may penetrate the body portion 410. Also, the second surface 410B of the body portion 410 may be positioned at the same level as the upper end of the through electrode 420' to form a flat surface.

Figure 4C:
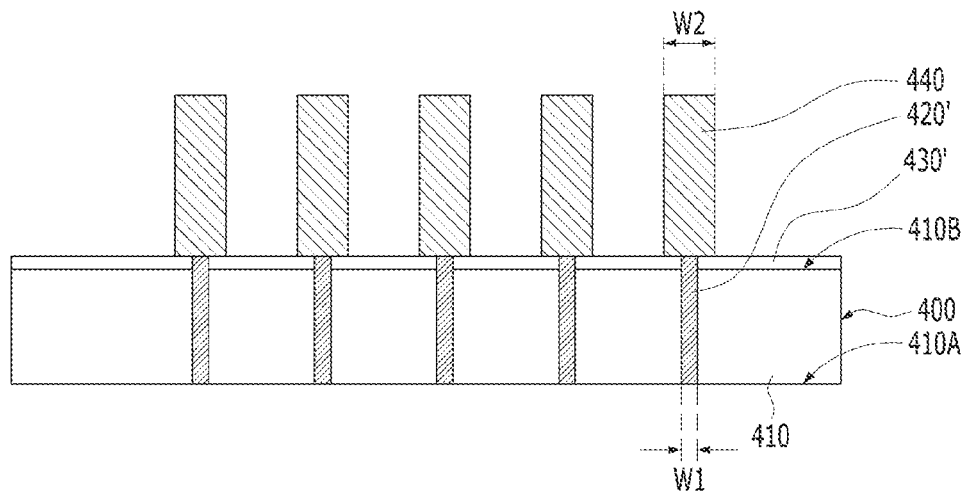

Referring to FIG. 4C, an additional connection electrode 440 connected to the through electrode 420' may be formed over the upper surfaces of the first protective layer 430' and the through electrode 420'.

The additional connection electrode 440 may be, as an example, a conductive bump. However, the present disclosure is not limited thereto, and the additional connection electrode 440 may include various metal materials, solder materials, or a combination thereof. In addition, the additional connection electrode 440 may have various shapes such as a pillar shape, a ball shape, or a combination thereof.

The additional connection electrode 440 may be formed by forming a photoresist (not shown), which has an opening exposing the through electrode 420', over the upper surfaces of the first protective layer 430' and the through electrode 420', forming the additional connection electrode 440 filling the opening by electroplating, and removing the photoresist by a strip process.

The additional connection electrode 440 may be formed of the same material as the through electrode 420', or may be formed of a different material from the through electrode 420'. In addition, the additional connection electrode 440 may have a width W2 greater than a width W1 of the through electrode 420' in the horizontal direction.

Figure 4D:
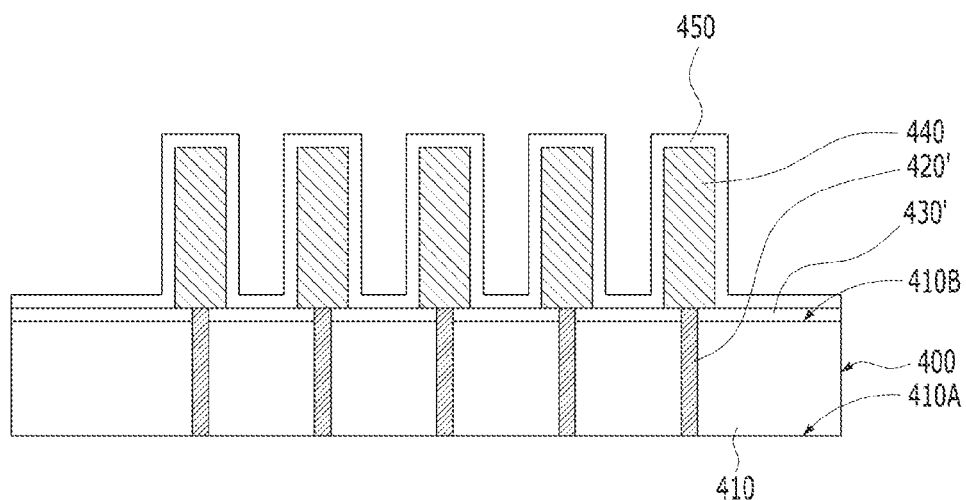

Referring to FIG. 4D, an initial second protective layer 450 may be formed over the upper surfaces of the first protective layer 430' and the additional connection electrode 440, along its lower profile.

The initial second protective layer 450 may be formed using a deposition method having excellent step coverage characteristics such as CVD. In addition, the initial second protective layer 450 may include various insulating materials such as silicon oxide, silicon nitride, or a combination thereof. The initial second protective layer 450 may be formed of the same material as the first protective layer 430', or may be formed of a different material from the first protective layer 430'.

Figure 4E:
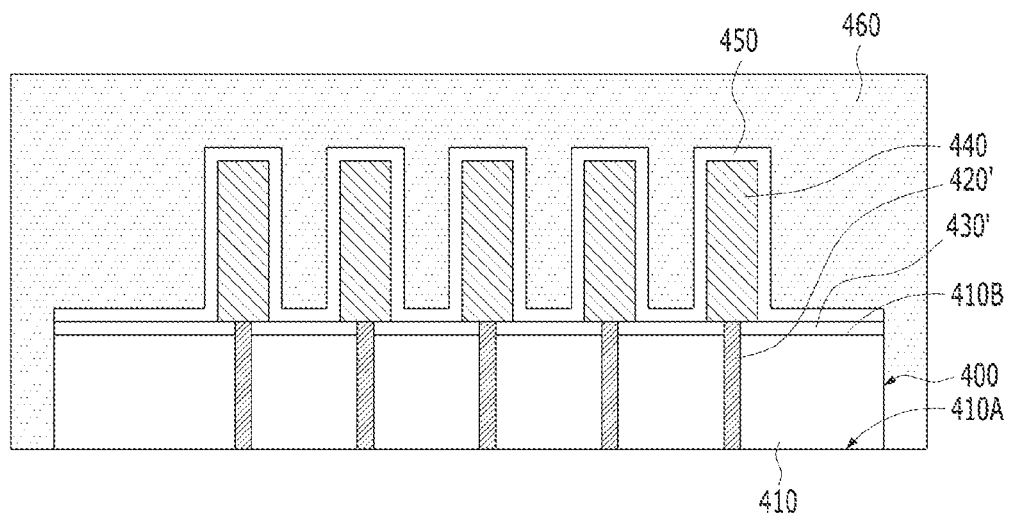

Referring to FIG. 4E, an initial molding layer 460 covering the semiconductor chip 400 in which the initial second protective layer 450 is formed, may be formed.

The initial molding layer 460 may be formed to cover the initial second protective layer 450 while surrounding the side surface of the semiconductor chip 400. Accordingly, the initial molding layer 460 may have an upper surface positioned at a higher level than the upper surface of the maximum height of the second initial protective layer 450.

Figure 4F:
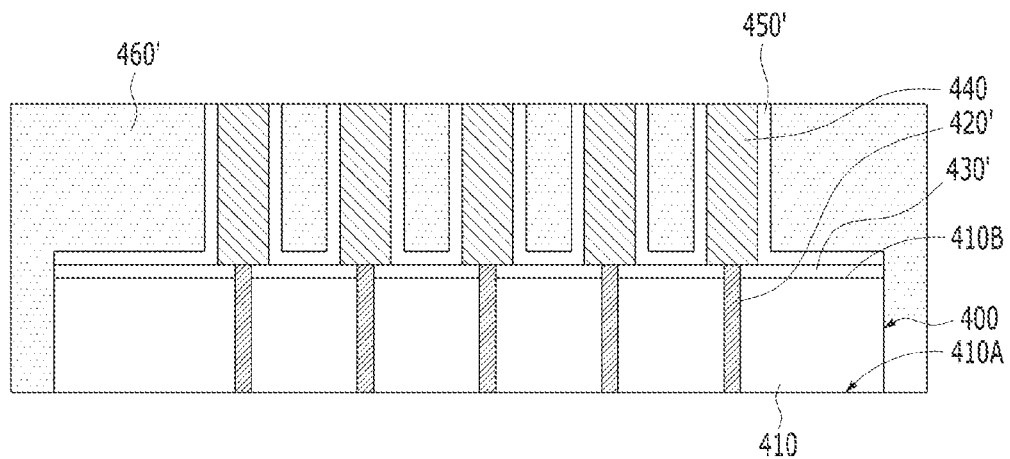

Referring to FIG. 4F, a planarization process may be performed so that the upper surface of the additional connection electrode 440 is exposed. This planarization process may be performed using grinding, CMP, or the like.

During the planarization process, the additional connection electrode 440 may be substantially maintained. That is, the additional connection electrode 440 might not be lost or may be lost to a very small extent. However, the present disclosure is not limited thereto, and a part of the additional connection electrode 440 may be lost.

As a result of this process, a part of the initial molding layer 460 and a part of the initial second protective layer 450, which are located over the additional connection electrode 440, may be removed to form a molding layer 460' and a second protective layer 450', respectively.

The second protective layer 450' may be formed over the side surface of the additional connection electrode 440 and the upper surface of the first protective layer 430', along its lower profile. Side and lower surfaces of the molding layer 460' between the additional connection electrodes 440 may be surrounded by the second protective layer 450'. Accordingly, the second protective layer 450' may be interposed between the molding layer 460' and the side surface of the additional connection electrode 440, and between the molding layer 460' and the upper surface of the first protective layer 430'. In the vertical direction, the upper surface of the molding layer 460', the upper surface of the maximum height of the second protective layer 450', and the upper surface of the additional connection electrode 440 may form a flat surface.

The body portion 410 and the molding layer 460' of FIG. 4F may correspond to the second body portion 132' and the molding layer 150' of FIG. 1D, respectively. The through electrode 420' and the additional connection electrode 440 of FIG. 4F may substantially correspond to the second through electrode 134 of FIG. 1D. In particular, the through electrode 420' of FIG. 4F may perform substantially the same function as the through portion 134A of the second through electrode 134 of FIG. 1D, and the additional connection electrode 440 of FIG. 4F may perform substantially the same function as the protruding portion 134B of the second through electrode 134 of FIG. 1D. However, the through portion 134A and the protruding portion 134B of FIG. 1D may be integrally formed, while the through electrode 420' and the additional connection electrode 440 of FIG. 4F may be formed in separate processes. Therefore, the through electrode 420' and the additional connection electrode 440 may have different widths and/or materials from each other.

Subsequent processes may be substantially the same as those described in FIGS. 1E and 1F. That is, although not shown, a package redistribution layer and/or an external connection electrode may be formed over the flat surface to be connected to the upper surface of the additional connection electrode 440.

According to the present embodiment, because the second protective layer 450' is further interposed between the adjacent additional connection electrodes 440, it may be possible to mitigate occurrence of defects due to metal ion movement between the additional connection electrodes 440.

Furthermore, because the width of the additional connection electrode 440 is increased, alignment and connection with the package redistribution layer and/or the external connection electrode may be facilitated.

FIGS. 5A to 5G are partial cross-sectional views illustrating a semiconductor package according to another embodiment of the present disclosure, and a method for fabricating the same.

Figure 5A:
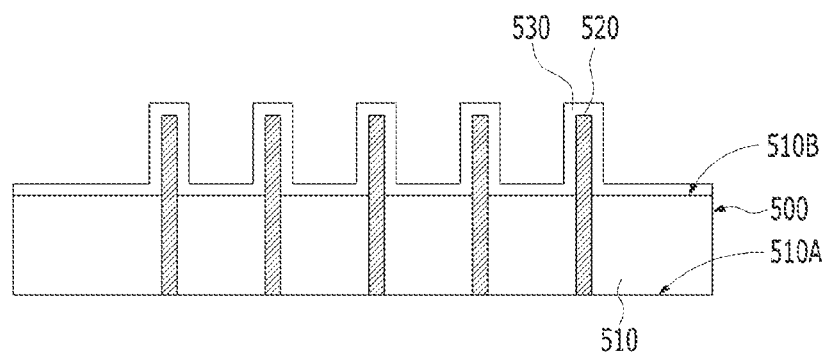
FIGS. 5A, 5B, 5C, 5D, 5E, 5F, and 5G are partial cross-sectional views illustrating a semiconductor package according to another embodiment of the present disclosure, and a method for fabricating the same.

Referring to FIG. 5A, a semiconductor chip 500 including a body portion 510 and an initial through electrode 520 may be provided.

The body portion 510 may include a first surface 510A and a second surface 510B positioned opposite to the first surface 510A. The initial through electrode 520 may protrude over the second surface 510B of the body portion 510 while penetrating the body portion 510.

Subsequently, an initial first protective layer 530 may be formed over the second surface 510B of the body portion 510 and the protruding portion of the initial through electrode 520, along its lower profile.

The initial first protective layer 530 may be formed using a deposition method having excellent step coverage characteristics such as CVD. In addition, the initial first protective layer 530 may include various insulating materials such as silicon oxide, silicon nitride, or a combination thereof.

Figure 5B:
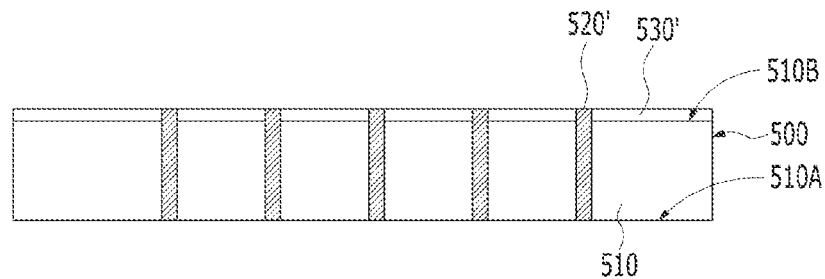

Referring to FIG. 5B, a planarization process, such as CMP, may be performed so that the protruding portion of the initial through electrode 520 is removed. This planarization process may be performed by targeting an upper surface of a part of the initial first protective layer 530, which is positioned over the second surface 510B of the body portion 510.

As a result of the present process, a first protective layer 530' positioned over the second surface 510B of the body portion 510, and a through electrode 520' penetrating the body portion 510 and the first protective layer 530', may be formed. The upper surface of the first protective layer 530' and the upper end of the through electrode 520' may be positioned at the same level in the vertical direction to form a flat surface.

However, the present disclosure is not limited thereto, and in another embodiment, the planarization process may be performed so that the second surface 510B of the body portion 510 is exposed. In this case, the initial first protective layer 530 may be removed, and the through electrode 520' may penetrate the body portion 510.

Figure 5C:
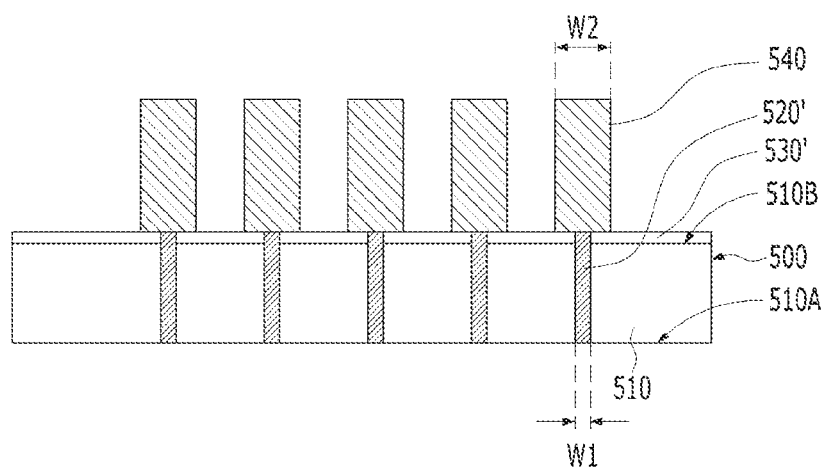

Referring to FIG. 5C, an additional connection electrode 540 may be formed over the upper surfaces of the first protective layer 530' and the through electrode 520' to be connected to the through electrode 520'.

The additional connection electrode 540 may be, as an example, a conductive bump. However, the present disclosure is not limited thereto, and the additional connection electrode 540 may include various metal materials, solder materials, or a combination thereof. In addition, the additional connection electrode 540 may have various shapes such as a pillar shape, a ball shape, or a combination thereof.

The additional connection electrode 540 may be formed of the same material as the through electrode 520', or may be formed of a different material from the through electrode 520'. In addition, the additional connection electrode 540 may have a width W2 greater than a width W1 of the through electrode 520' in the horizontal direction.

Figure 5D:
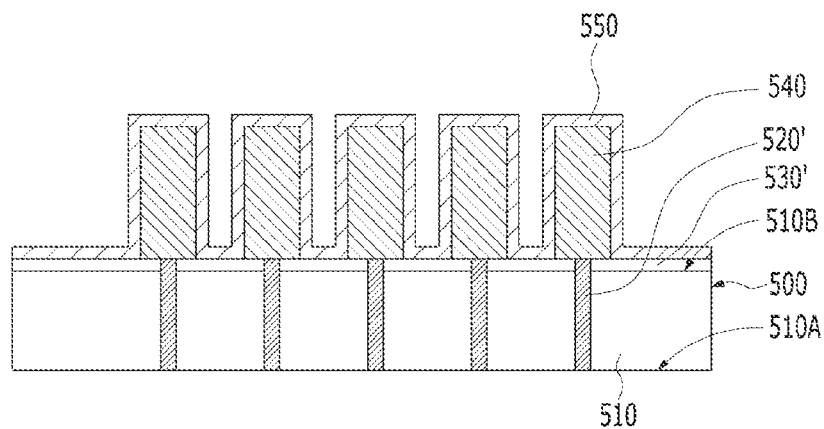

Referring to FIG. 5D, an initial metal barrier layer 550 may be formed over the upper surfaces of the first protective layer 530' and the additional connection electrode 540, along its lower profile.

The initial metal barrier layer 550 may serve to mitigate the movement of metal ions from the additional connection electrode 540. The initial metal barrier layer 550 may be formed by a deposition method having excellent step coverage characteristics such as CVD. In addition, the initial metal barrier layer 550 may include a metal such as titanium or tantalum, or a compound of the metal.

Figure 5E:
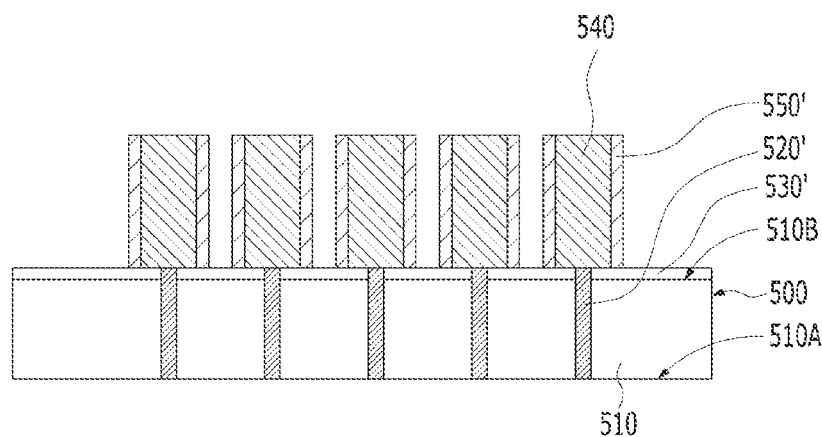

Referring to FIG. 5E, a metal barrier layer 550' may be formed by removing a part of the initial metal barrier layer 550, which is located over the upper surface of the first protective layer 530'. That is, the metal barrier layer 550', which is in contact with one of the additional connection electrodes 540 may be electrically and physically separated from the metal barrier layer 550', which is in contact with adjacent one of the additional connection electrodes 540. If such electrical and physical separation is not made, an electrical short between the additional connection electrodes 540 may occur.

In the present embodiment, the removal process of the part of the initial metal barrier layer 550 may be performed by using a blanket dry etching method. In this case, the metal barrier layer 550' may be formed only on the side surface of the additional connection electrode 540. However, the present disclosure is not limited thereto, and the metal barrier layer 550' may be further present on the upper surface of the additional connection electrode 540.

Figure 5F:
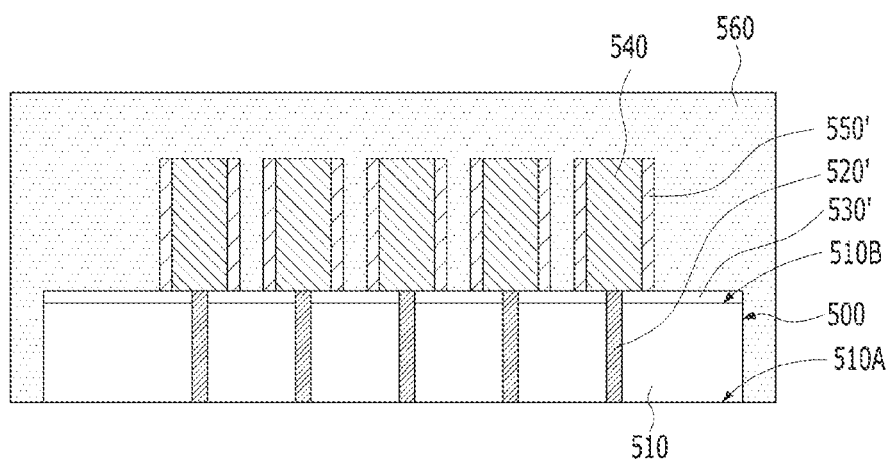

Referring to FIG. 5F, an initial molding layer 560 covering the semiconductor chip 500 in which the metal barrier layer 550' is formed, may be formed.

The initial molding layer 560 may be formed to cover the metal barrier layer 550' and the additional connection electrode 540 while surrounding the side surface of the semiconductor chip 500. Accordingly, the initial molding layer 560 may have an upper surface positioned at a higher level than the upper surfaces of the additional connection electrode 540 and the metal barrier layer 550'.

Figure 5G:
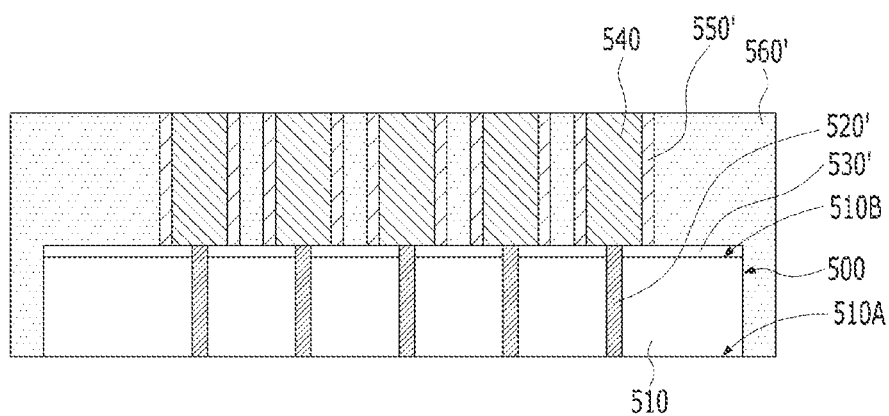

Referring to FIG. 5G, a planarization process may be performed so that the upper surface of the additional connection electrode 540 is exposed. This planarization process may be performed using grinding, CMP, or the like.

During the planarization process, the additional connection electrode 540 may be substantially maintained. That is, the additional connection electrode 540 might not be lost or may be lost to a very small extent. However, the present disclosure is not limited thereto, and a part of the additional connection electrode 540 may be lost.

As a result of the present process, a part of the initial molding layer 560 located over the additional connection electrode 540 may be removed to form a molding layer 560'.

The metal barrier layer 550' may be interposed between the side surface of the additional connection electrode 540 and the molding layer 560'. In the vertical direction, the upper surface of the molding layer 560', the upper surface of the metal barrier layer 550', and the upper surface of the additional connection electrode 540 may form a flat surface.

The body portion 510 and the molding layer 560' of FIG. 5G may correspond to the second body portion 132' and the molding layer 150' of FIG. 1D, respectively. The through electrode 520' and the additional connection electrode 540 of FIG. 5G may substantially correspond to the second through electrode 134 of FIG. 1D. In particular, the through electrode 520' of FIG. 5G may perform substantially the same function as the through portion 134A of the second through electrode 134 of FIG. 1D, and the additional connection electrode 540 of FIG. 5G may perform substantially the same function as the protruding portion 134B of the second through electrode 134 of FIG. 1D. However, the through portion 134A and the protruding portion 134B of FIG. 1D may be integrally formed, while the through electrode 520' and the additional connection electrode 540 of FIG. 5G may be formed in separate processes. Therefore, the through electrode 520' and the additional connection electrode 540 may have different widths and/or materials from each other.

Subsequent processes may be substantially the same as those described in FIGS. 1E and 1F. That is, although not shown, a package redistribution layer and/or an external connection electrode may be formed over the flat surface to be connected to the upper surface of the additional connection electrode 540.

According to the present embodiment, because the metal barrier layer 550' is further interposed between the adjacent additional connection electrodes 540, it may be possible to mitigate the occurrence of defects due to the movement of metal ions between the additional connection electrodes 540.

Furthermore, because the width of the additional connection electrode 540 is increased, alignment and connection with the package redistribution layer and/or the external connection electrode may be facilitated.

According to the above embodiments of the present disclosure, it may be possible to provide a semiconductor package capable of having a thin thickness and reducing process defects while satisfying the demands of high integration/high capacity.

Figure 6:
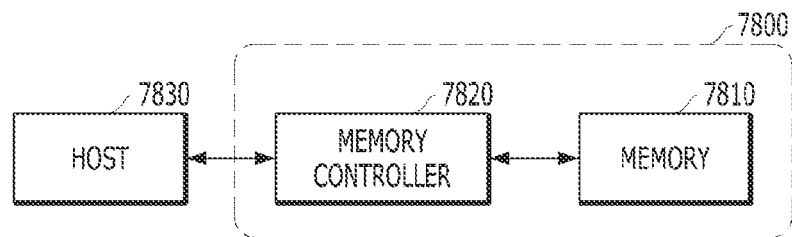
FIG. 6 shows a block diagram illustrating an electronic system employing a memory card including a semiconductor package, according to an embodiment.

FIG. 6 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 7:
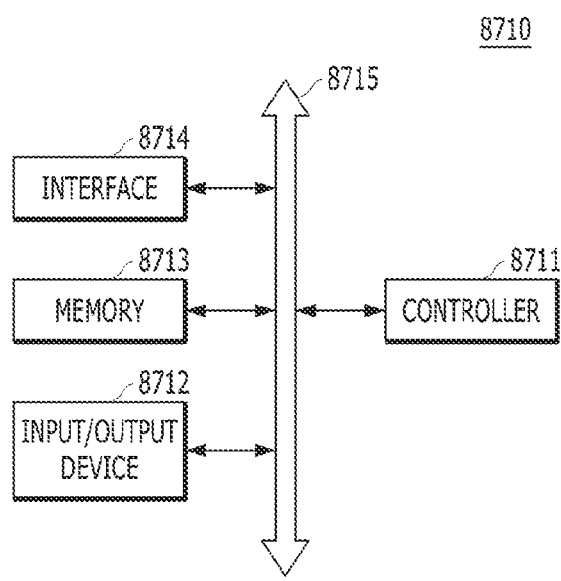
FIG. 7 shows a block diagram illustrating another electronic system including a semiconductor package, according to an embodiment.

FIG. 7 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
   a second semiconductor chip including a second body portion, a second through electrode that penetrates the second body portion, and a second connection electrode that is connected to one end of the second through electrode;
   a first semiconductor chip stack disposed over the second semiconductor chip and including a plurality of first semiconductor chips stacked in a vertical direction, wherein each of the plurality of first semiconductor chips includes a first body portion, a first through electrode penetrating the first body portion, and a first connection electrode connected to one end of the first through electrode;

a molding layer surrounding side surfaces of the second semiconductor chip and the first semiconductor chip stack;

a third semiconductor chip disposed over the molding layer and the first semiconductor chip stack; and an external connection electrode electrically connected to an other end of the second through electrode, wherein, the second semiconductor chip and the plurality of first semiconductor chips are electrically connected through the second through electrode, the second connection electrode, the first through electrodes, and the first connection electrodes.

2. The semiconductor package according to claim 1, wherein the first semiconductor chip includes a memory chip, and the second semiconductor chip includes a logic chip for controlling the memory chip.

3. The semiconductor package according to claim 2, wherein the third semiconductor chip includes a memory chip substantially the same as the memory chip of each of the first semiconductor chips.

4. The semiconductor package according to claim 1, wherein the third semiconductor chip is electrically connected to the second semiconductor chip and the plurality of first semiconductor chips through the second through electrode, the second connection electrode, the first through electrodes, and the first connection electrodes.

5. The semiconductor package according to claim 1, wherein the third semiconductor chip is a dummy semiconductor chip.

6. The semiconductor package according to claim 1, wherein a planar area of the third semiconductor chip is greater than a planar area of the first semiconductor chip and a planar area of the second semiconductor chip.

7. The semiconductor package according to claim 1, wherein a side surface of the third semiconductor chip are aligned with a side surface of the molding layer.

8. The semiconductor package according to claim 1, wherein a planar area of the first semiconductor chip and a planar area of the second semiconductor chip are substantially the same as each other.

9. The semiconductor package according to claim 1, wherein the side surface of the first semiconductor chip stack and the side surface of the second semiconductor chip are aligned with each other.

10. The semiconductor package according to claim 1, further comprising:

a package redistribution layer disposed between the second semiconductor chip and the external connection electrode, and electrically connecting the other end of the second through electrode and the external connection electrode.

11. The semiconductor package according to claim 1, wherein the second connection electrode is disposed over a first surface of the second body portion, and the molding layer has one surface located at the same level as a second surface of the second body portion, which is located opposite to the first surface of the second body portion.

12. The semiconductor package according to claim 1, wherein the second connection electrode is disposed over a first surface of the second body portion, the second through electrode includes a through portion penetrating the second body portion, and a protruding portion connected to the through portion and protruding over a second surface of the second body portion, which is located opposite to the first surface of the second body portion, and the molding layer covers the second surface of the second body portion and surrounds a side surface of the protruding portion.

13. The semiconductor package according to claim 12, further comprising:

a protective layer interposed between the molding layer and the side surface of the protruding portion of the second through electrode.

14. The semiconductor package according to claim 13, wherein the protective layer includes an insulating material.

15. The semiconductor package according to claim 14, wherein the protective layer is further interposed between the second surface of the second body portion and the molding layer.

16. The semiconductor package according to claim 1, wherein the second connection electrode is disposed over a first surface of the second body portion, and the semiconductor package further comprising:

an additional connection electrode disposed over a second surface of the second body portion, which is located opposite to the first surface of the second body portion, and connected to the second through electrode, and wherein the molding layer covers the second surface of the second body portion and surrounds a side surface of the additional connection electrode.

17. The semiconductor package according to claim 16, further comprising:

a protective layer interposed between the molding layer and the side surface of the additional connection electrode.

18. The semiconductor package according to claim 17, wherein the protective layer includes an insulating material.

19. The semiconductor package according to claim 17, wherein the protective layer is further interposed between the second surface of the second body portion and the molding layer.

20. The semiconductor package according to claim 16, further comprising:

a metal barrier layer interposed between the side surface of the additional connection electrode and the molding layer.

21. The semiconductor package according to claim 16, wherein a width of the additional connection electrode is greater than a width of the second through electrode.

22. The semiconductor package according to claim 1, wherein a thickness of the third semiconductor chip, a thickness of the first body portion of each of the first semiconductor chips, and a thickness of the second body portion of the second semiconductor chip all have substantially the same value.

* * * * *